(12) United States Patent
Muraya

(10) Patent No.: US 7,154,293 B2
(45) Date of Patent: Dec. 26, 2006

(54) HIGH-SPEED TRANSMITTER CIRCUIT

(75) Inventor: Keisuke Muraya, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/066,809

(22) Filed: Feb. 28, 2005

(65) Prior Publication Data

US 2005/0140393 A1  Jun. 30, 2005

Related U.S. Application Data

(63) Continuation of application No. PCT/JP02/123853, filed on Dec. 9, 2002.

(51) Int. Cl.
*H03K 19/01* (2006.01)

(52) U.S. Cl. .......................... 326/17; 326/29

(58) Field of Classification Search ............... 326/17, 326/27–29; 327/170, 264
See application file for complete search history.

(56) References Cited

U.S. PATENT DOCUMENTS 4,797,579 A * 1/1989 Lewis .................... 326/27

5,111,080 A     5/1992  Mizukami et al. .......... 326/30
5,926,050 A *   7/1999  Proebsting ................. 327/170
5,929,680 A *   7/1999  Lim ......................... 327/264

FOREIGN PATENT DOCUMENTS

| JP | 3-171849    | 7/1991  |
|----|-------------|---------|
| JP | 9-214306    | 8/1997  |
| JP | 11-274908   | 10/1999 |
| JP | 2000-332590 | 11/2000 |

* cited by examiner

*Primary Examiner*—James H. Cho
(74) *Attorney, Agent, or Firm*—Staas & Halsey LLP

(57) ABSTRACT

A signal for the single-wire circuit is inputted and separated into two signals by the input separator circuit and the two signals are inputted in parallel into the two-wire transmitter circuit comprises at least one set of logic gates in which a P-channel CMOS transistor and a N-channel CMOS transistor whose size is different from that of the P-channel CMOS transistor are complementarily connected. The two-wire transmitter circuit outputs a first signal speeded up the rising transition time thereof from one of the logic gates and also outputs a second signal speeded up the falling transition time thereof from the other of the logic gates. The output converter circuit inputs in parallel the first signal and the second signal outputted from the two-wire transmitter circuit and converts them into a signal for the single-wire circuit.

16 Claims, 16 Drawing Sheets

FIG. 8A  E1 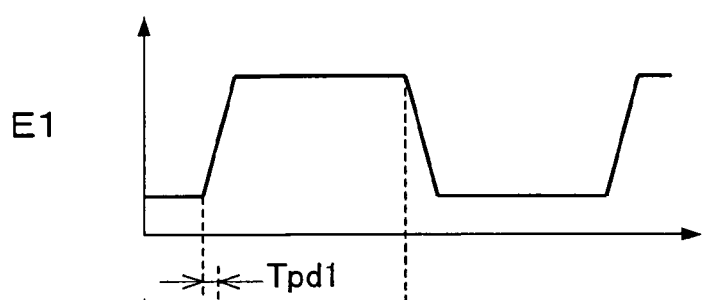
FIG. 8B  E2 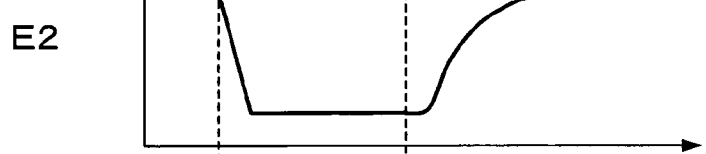
FIG. 8C  E3 
FIG. 8D  E4 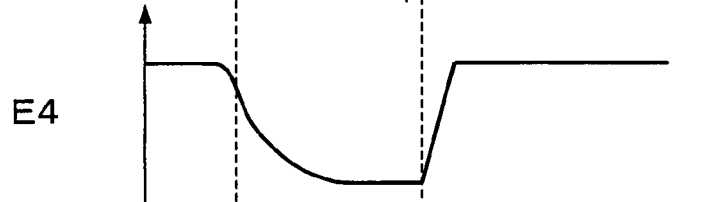
FIG. 8E  E5 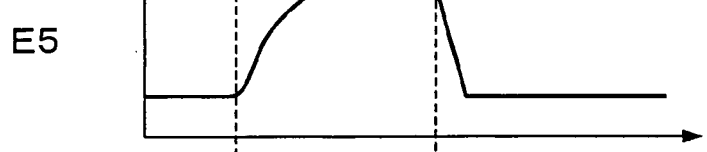
FIG. 8F  E6 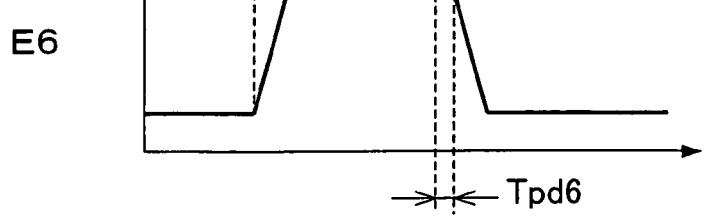

FIG. 10

| F.O | WIRE LENGTH [grid] | CONVENTIONAL CMOS | | PRESENT INVENTION (NEW CIRCUIT) | | |
|---|---|---|---|---|---|---|
| | | | | $\gamma=0.5$ | $\gamma=0.4$ | $\gamma=0.3$ |
| | | SIZE=1 | SIZE=2 | SIZE=1.5 | SIZE=1.4 | SIZE=1.3 |
| 1 | 10 | 61.2 | 59.1 | 52.8 | 49.3 | 45.9 |
| | 20 | 64.1 | 61.3 | 55.8 | 53.0 | 49.4 |
| | 50 | 73.1 | 66.2 | 66.0 | 63.5 | 60.0 |
| | 100 | 90.1 | 74.6 | 82.8 | 80.6 | 77.2 |
| 2 | 10 | 78.3 | 76.7 | 66.0 | 62.4 | 58.3 |
| | 20 | 82.8 | 78.5 | 69.5 | 65.3 | 61.1 |
| | 50 | 91.9 | 85.2 | 80.2 | 75.7 | 71.7 |
| | 100 | 108.0 | 92.9 | 96.6 | 93.1 | 89.3 |
| 4 | 10 | 113.3 | 111.5 | 93.0 | 86.9 | 80.9 |
| | 20 | 116.4 | 113.9 | 95.9 | 90.8 | 83.9 |
| | 50 | 125.7 | 119.3 | 105.7 | 100.1 | 94.1 |
| | 100 | 142.3 | 128.5 | 122.0 | 116.5 | — |
| 8 | 10 | 180.8 | 179.3 | 142.8 | 133.2 | — |
| | 20 | 184.1 | 181.6 | 146.1 | 136.8 | — |
| | 50 | 194.0 | 187.7 | 156.1 | 146.7 | — |
| | 100 | 210.9 | 198.4 | 172.6 | — | — |

Tpd BASED ON SPICE SIMULATION (MEASURE OF TIME : ps)

FIG. 12
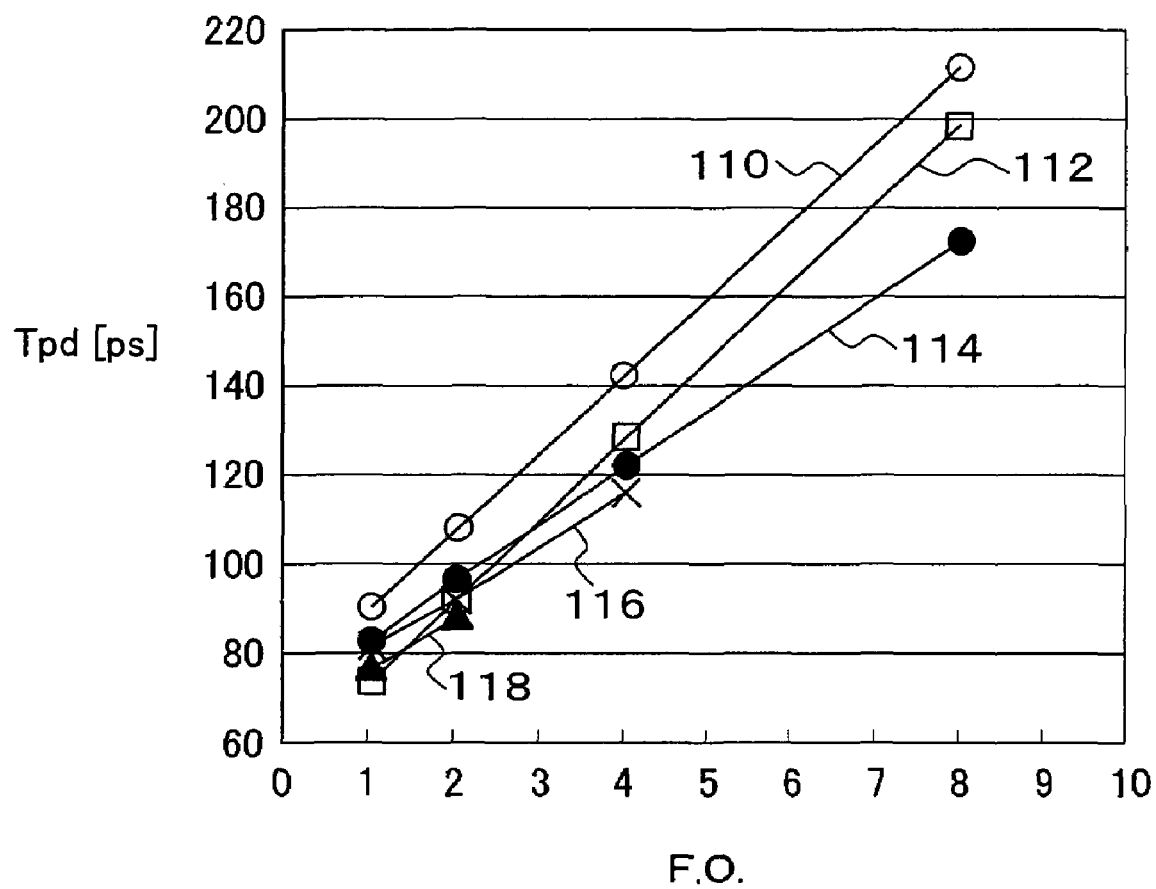
WIRE LENGTH=100grid
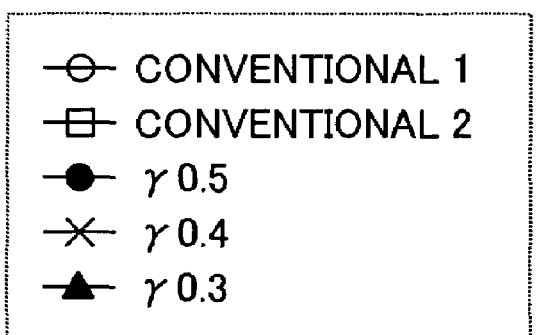

FIG. 17B
PRIOR ART
FIG. 17A
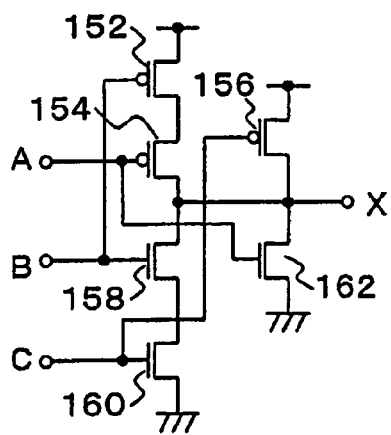
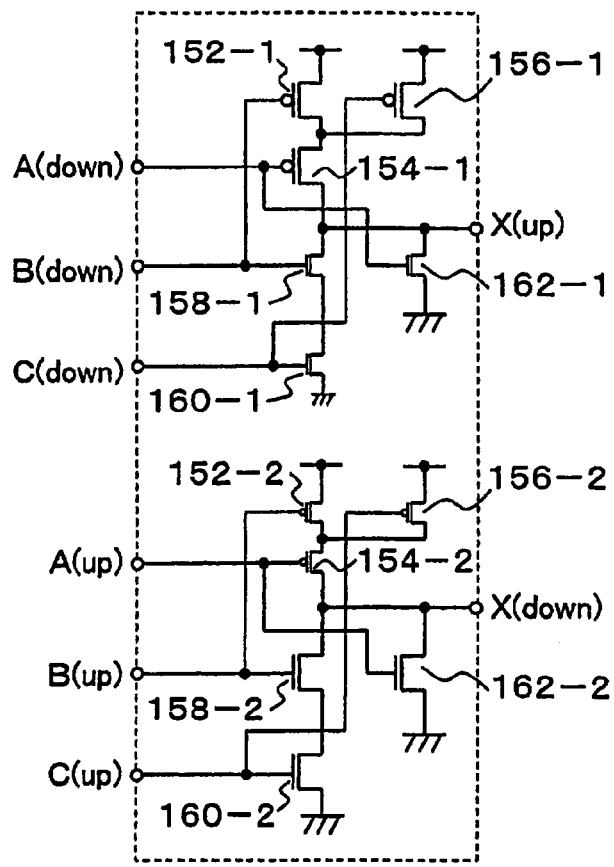

HIGH-SPEED TRANSMITTER CIRCUIT

This application is a continuing application, filed under 35 U.S.C. § 111(a), of International Application PCT/JP02/12853, filed Dec. 9, 2002.

TECHNICAL FIELD

The present invention relates to a high-speed transmitter circuit using CMOS transistors integrated on a semiconductor, especially, a high-speed transmitter circuit having a two-wire gate circuit to reduce the parasitic capacitance of the CMOS transistors to achieve high-speed transmission.

BACKGROUND ART

In conventional CMOS gate circuits used for semiconductor integrated circuits, when the rising transition of the output voltage signal of a front gate occurs, the wire capacitance and the input capacitance of a subsequent gate are charged so that the output voltage signal of the subsequent gate is fallen. Alternatively, when the falling transition of the output voltage signal of the front gate occurs, the wire capacitance and the input capacitance of the subsequent gate are discharged so that the output voltage signal of the subsequent gate is risen.

FIG. 1 is an inverter using the conventional CMOS transistor. In the inverter, a P-channel CMOS transistor 200 and a N-channel CMOS transistor 202 are complementarily connected. For example, when the output of a front inverter 204 falls to 0, the P-channel CMOS transistor 200 is turned on and the N-channel CMOS transistor 202 is turned off so that the output is transferred to 1. Alternatively, when the output of the front inverter 204 rises to 1, the P-channel CMOS transistor 200 is turned off and the N-channel CMOS transistor 202 is turned on so that the output is transferred to 0.

In such conventional inverter, the size of both of the P-channel CMOS transistor 200 and the N-channel CMOS transistor 202 are enlarged in order to speed up the falling transition and the rising transition of the output responsive to the rising transition and the falling transition, respectively.

Where, paying attention to the timing at which the P-channel CMOS transistor 200 is turned on and the N-channel CMOS transistor 202 is turned off as FIG. 2, since the voltage waveform passed through the P-channel CMOS transistor 200 which is turned on should be rapidly transferred, it is enlarged according to need. Meanwhile the N-channel CMOS transistor 202 might be downsized to facilitate to be turned off in this case.

However, in the conventional circuit, when the P-channel CMOS transistor 200 is turned off and the N-channel CMOS transistor 202 is turned on in the subsequent reversed phase output transition, the voltage waveform also should be rapidly transferred so that the transistor size is normally designed as P/N=2 in order to enable the high-speed transition at both of the rising and the falling of the output. Therefore, in the conventional CMOS circuit, the transistor turned off can not be downsized because it will be turned on at the next process nevertheless the size of the transistor turned off is enough to be smaller. Thus the unnecessary capacitance is included because of the above described large size so that the passing delay is increased thereby the high-speed transmission is prevented. Where the passing delay $T_{pd}$ of the gate is essentially expressed by the following formula.

$$T_{pd} = \frac{C \cdot V}{I} \tag{1}$$

(where, C is capacitance, V is voltage, and I is on-state current of the transistor) According to the formula, the passing delay $T_{pd}$ of the gate can be reduced by decreasing the capacitance C or the voltage V, or increasing the on-state current I. The capacitance C includes a parasitic capacitance such as a gate capacitance and a junction capacitance in the CMOS transistor's own, and a load capacitance such as a wiring. The parasitic capacitance in the transistor's own is increased in proportion as the transistor size thereby the high-speed transmission is prevented.

DISCLOSURE OF INVENTION

The object of the present invention is that the transistor is downsized to reduce the unnecessary capacitance so that a high-speed transmitter circuit to speed up its operation is provided.

The high-speed transmitter circuit of the present invention comprises an input separator circuit to input a signal for a single-wire circuit and separate it into two signals, a two-wire transmitter circuit including at least one set of logic gates in which a P-channel CMOS transistor and a N-channel CMOS transistor whose size is different from that of the P-channel CMOS transistor are complementarily connected to output a first signal speeded up the rising transition time thereof from one of the logic gates and also output a second signal speeded up the falling transition time thereof from the other of the logic gates and an output converter circuit to input in parallel the first signal and the second signal outputted from the two-wire transmitter circuit and convert them into a signal for the single-wire circuit.

Thus the logic gate of the present invention includes the P-channel CMOS transistor and the N-channel CMOS transistor and either of the two transistors is downsized thereby the load gate capacitance of the transistor parasitized in the gate input unit and the junction capacitance of the transistor parasitized in the gate output unit can be reduced. Where, the capacitance of the whole logic gate is reduced while the load drive capability per wire is maintained so that the output voltage waveform is rapidly transferred when the larger CMOS transistor is turned on. Additionally, if the logic gate is connected in multistage, the load capacitance of the subsequent stage is reduced than conventional CMOS circuits so that the high-speed transmission can be achieved.

The two-wire transmitter circuit of the present invention comprises a first logic gate in which at least one set of a larger P-channel CMOS transistor and a smaller N-channel CMOS transistor are provided and the rising transition time of the output signal (output voltage waveform) responsive to the change of the input signal is speeded up, and a second logic gate in which at least one set of a smaller P-channel CMOS transistor and a larger N-channel CMOS transistor are provided and the falling transition time of the output signal (output voltage waveform) responsive to the change of the input signal is speeded up. With respect to the size ratio between the P-channel CMOS transistor and the N-channel CMOS transistor, if the size of the larger transistor is 1, the size ratio of the smaller one is less than 1. Specifically, if the size of the larger transistor is 1, the size ratio of the smaller one is such as 0.3–0.5.

The two-wire transmitter circuit is such as a two-wire inverter, which comprises a first inverter in which a larger P-channel CMOS transistor and a smaller N-channel CMOS transistor are complementarily connected and the rising transition time of the output signal responsive to the falling of the input signal is speeded up, and a second inverter in which a smaller P-channel CMOS transistor and a larger N-channel CMOS transistor are complementarily connected and the falling transition time of the output signal responsive to the rising of the input signal is speeded up. The two-wire inverter is complementarily connected in multistage. That is to say, the two-wire inverter is complementarily connected in multistage such that the output of the front first inverter is connected to the input of the subsequent second inverter while the output of the front second inverter is connected to the input of the subsequent first inverter.

The two-wire transmitter circuit is two-wire NAND gate, which comprises a first NAND gate in which the rising transition time of the output signal responsive to the change of a plurality of input signals is speeded up and a second NAND gate in which the falling transition time of the output signal responsive to the change of a plurality of input signals is speeded up.

The two-wire transmitter circuit is two-wire NOR gate, which comprises a first NOR gate in which the rising transition time of the output signal responsive to the change of a plurality of input signals is speeded up and a second NOR gate in which the falling transition time of the output signal responsive to the change of a plurality of input signals is speeded up.

The output converter circuit picks up the rising edge of the output signal speeded up the rising transition time thereof from the first logic gate and the falling edge of the output signal speeded up the falling transition time thereof from the second logic gate, respectively and converts them into a output signal for the single-wire circuit. If each output terminal of the two-wire transmitter circuit of the present invention is simply short-circuited, the low-speed edge of the rising or the falling may be picked up, but it should be prevented and only the high-speed edge should be surely picked up to connect to the single-wire circuit, i.e. the conventional CMOS circuit.

Accordingly, the output converter circuit, for example comprises a first transfer gate to pass the rising edge of the output signal speeded up the rising transition time thereof from the first logic gate and supply it to a single-wire output terminal, a second transfer gate to pass the falling edge of the output signal speeded up the falling transition time thereof from the second logic gate and supply it to a single-wire output terminal and a control circuit to repeatedly perform the following steps: opening the first transfer gate in the state that the output signals of both of the first logic gate and the second logic gate are 0 and latching the opening state; supplying a rising edge to 1 of the first logic gate from the opening first transfer gate to the single-wire output terminal; closing the first transfer gate after a predetermined period; alternatively opening the second transfer gate to supply the signal at level 1 outputted from the subsequent second logic gate to the single-wire output terminal; opening the second transfer gate in the state that the output signals of both of the first logic gate and the second logic gate are 1 and latching the opening state; supplying the falling edge to 0 of the output signal of the second logic gate from the opening second transfer gate to the single-wire output terminal and closing the second transfer gate after a predetermined period, alternatively opening the first transfer gate to supply the signal at level 0 outputted from the subsequent first logic gate to the single-wire output terminal.

Further the present invention provides a two-wire transmitter circuit. The two-wire transmitter circuit comprises at least one set of logic gates in which a P-channel CMOS transistor and a N-channel CMOS transistor whose size is different from that of the P-channel CMOS transistor are complementarily connected, wherein a first signal speeded up the rising transition time thereof is outputted from one of the logic gates and a second signal speeded up the falling transition time thereof from the other of the logic gates. Incidentally, the detail of the two-wire transmitter circuit is same as the high-speed transmitter circuit.

The present invention provides a high-speed transmitting method of a circuit. The high-speed transmitting method comprises the steps of:

inputting a signal for a single-wire circuit and separating the signal into two signals;

outputting a first signal of which the rising transition time is speeded up from one of at least a pair of logic gates complementarily connected to a P-channel CMOS transistor and an N-channel CMOS transistor of different sizes, and outputting a second of which the falling transition time is speeded up from the other of said logic gates; and inputting the first signal and the second signal outputted as above in parallel, and converting the signals into a signal for the single-wire circuit.

BRIEF DESCRIPTION OF DRAWINGS

FIGS. 8A–8F are time charts of the voltage signal waveform of each unit of FIG. 3;

FIG. 10 is an explanatory view of the result of the simulation comparing the passing delay according to the present invention with the conventional circuit;

FIG. 12 is a graphical diagram representing the passing delay according to the present invention relative to the number of fan-out when the wire length is fixed to 100 grid based on FIG. 10 in contradistinction to the conventional circuit;

FIGS. 17A–17B are circuit diagrams of an example of the application to the composite gate including OR, AND and an inverter.

BEST MODE FOR CARRYING OUT THE INVENTION

Figure 1:
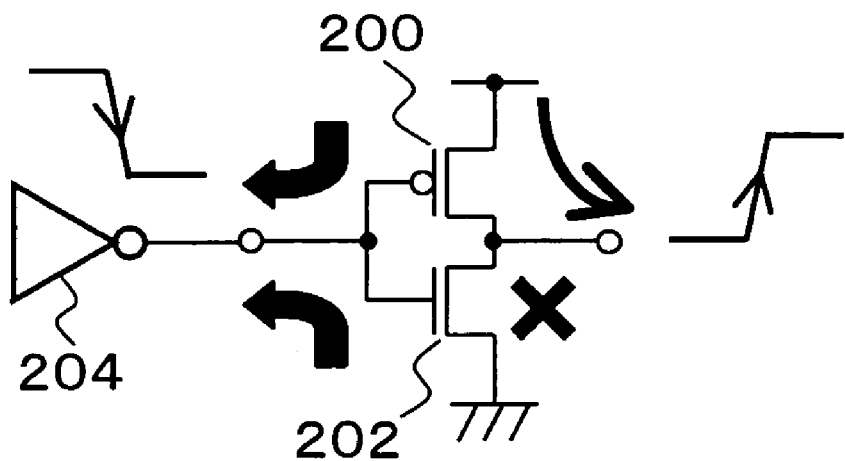
FIG. 1 is an explanatory view of the switching operation of the conventional CMOS inverter.
Figure 2:
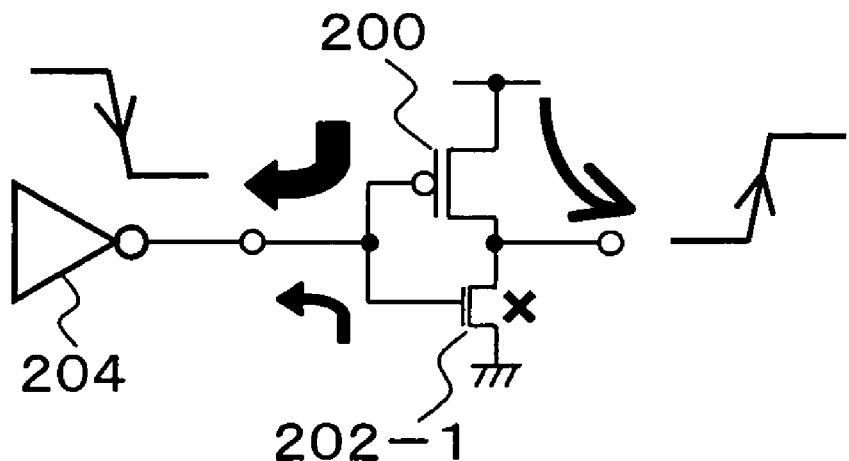
FIG. 2 is an explanatory view of the switching operation of the CMOS inverter speeded up the output rising transition thereof.
Figure 3:
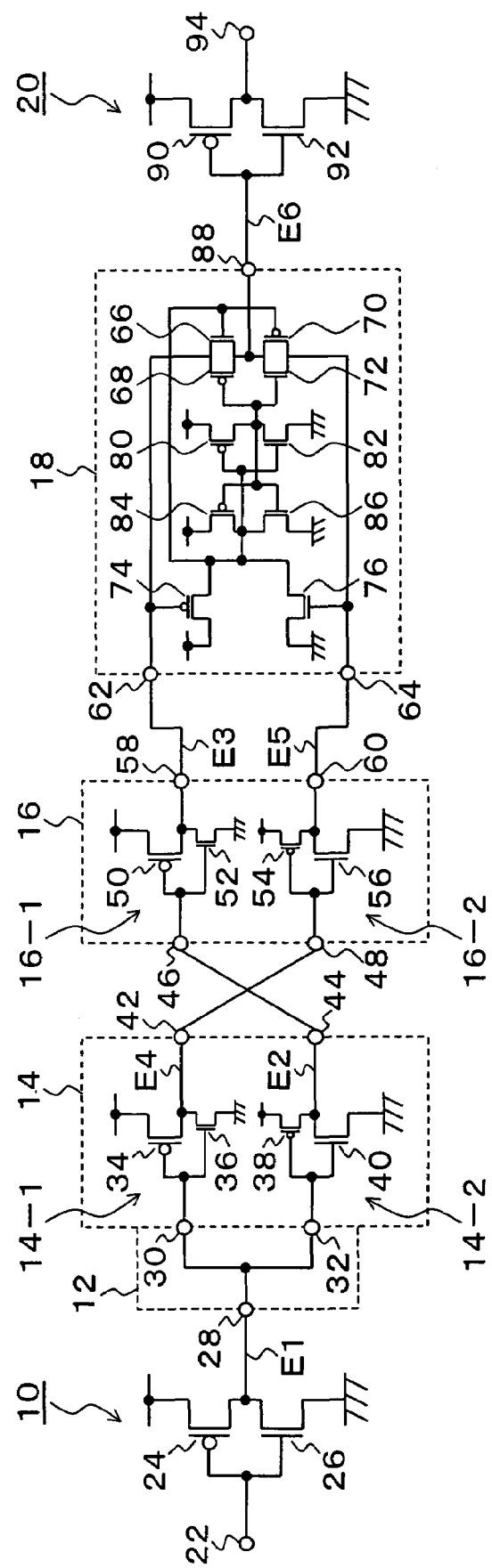
FIG. 3 is a circuit diagram of the high-speed transmitter circuit according to the present invention including an inverter chain.

FIG. 3 is a circuit diagram representing one embodiment of the high-speed transmitter circuit according to the present invention. The high-speed transmitter circuit of the present invention comprises a single-wire inverter 10, an input separator circuit 12, a two-wire inverter 14, a two-wire inverter 16, an output converter circuit 18 and a single-wire inverter 20 in FIG. 3. The single-wire inverter 10 provided at the input and the single-wire inverter 20 provided at the output are inverters using the conventional CMOS circuit, and the high-speed transmitter circuit according to the present invention is provided therebetween. The single-wire inverter 10 at the input has an input terminal 22 and an output terminal 28, and a P-channel CMOS field effect transistor 24 and a N-channel CMOS field effect transistor 26 are complementarily connected therebetween. The size of the two transistors is P/N=about 2. Incidentally, hereinafter the P-channel CMOS field effect transistor (P-channel MOSFET) is referred to as P transistor and the N-channel CMOS field effect transistor (N-channel MOSFET) is referred to as N transistor.

The input separator circuit 12 inputs the output of the single-wire inverter 10 from the output terminal 28 and separates it into two signals for a terminal 30 and a terminal 32. The two-wire inverter 14 comprises a first logic gate 14-1 and a second logic gate 14-2. The first logic gate 14-1 composes an inverter in which a conventional sized P transistor 34 and a smaller N transistor 36 than the conventional ones are complementarily connected. Alternatively the second logic gate 14-2 composes an inverter in which a smaller P transistor 38 than the conventional ones and a conventional sized N transistor 40 are complementarily connected. Where, paying attention to the first logic gate 14-1, the P transistor 34 is turned on responsive to the falling from 1 to 0 at the input terminal 30 while the N transistor 36 is turned off thereby the signal of the output terminal 42 rises from 0 to 1. At this time, the P transistor 34 turned on according to the falling to 0 at the input terminal is sufficiently flowed a current because it is large in size. Alternatively, the N transistor 36 turned off according to the falling to 0 at the input can be rapidly turned off because it is small in size and its gate capacitance is also small. That is to say, in the first logic gate 14-1, the output signal when the input signal falls from 1 to 0, specifically, the rising transition time of the output voltage waveform signal is speeded up.

The size of the transistors in the single-wire inverter 10 and 20 using the conventional CMOS circuit is usually P/N=about 2. If the size ratio of each of the P transistor and the N transistor is 1, the size ratio γ of the P transistor 34 provided at the first logic gate 14-1 in the two-wire inverter 14 is 1 because its size is same as the conventional ones. Alternatively, the size ratio γ of the N transistor 36 is 0<1 because its size is smaller than the conventional ones. In the same way, the size ratio γ of the N transistor 40 provided at the second logic gate 14-2 is 1 because its size is same as the conventional ones, and the size ratio γ of the P transistor 38 is 0<1 because its size is smaller than the conventional ones. Specifically, the value of the size ratio γ is within 0.3–0.5. Accordingly, if the total size of P transistor 24 and the N transistor 26 in the single-wire inverter 10 as the conventional circuit is 1, the total size of the two-wire inverter 14 according to the present invention is 1+γ. Where the simple average of the total size ratio of the P transistor and the N transistor of either of the first logic gate or the second logic gate is (1+γ)/2.

The passing delay $T_{pd}$ of the CMOS gate is expressed in detail by the following formula;

$$T_{pd} = \frac{(C_1 + C_2 + C_3 + n \cdot C_4) \cdot V}{I} \quad (2)$$

where, $C_1$: the gate capacitance of the drive gate
$C_2$: the junction capacitance of the drive gate
$C_3$: the wiring load capacitance
$C_4$: the load gate input capacitance per wire
n: the number of fan-out As evidenced by the formula (2), in the first logic gate 14-1 of the two-wire inverter 14 according to the present invention, the N transistor 36 whose size ratio γ less than 1 can be reduced the gate capacitance $C_1$ and the junction capacitance $C_2$ of the drive gate than the single-wire inverter 10 as the conventional circuit because it is small in size. Additionally, the capacitance of the whole gate as the logic gate is reduced while the load drive capability per wire is maintained so that a high-speed rising transition of the output voltage waveform occurs when the P transistor 34 whose size ratio is 1 is turned on.

Alternatively, in the second logic gate 14-2 provided in the two-wire inverter 14, the smaller P transistor 38 and the larger transistor 40 are complementarily connected contrary to the front logic circuit 14-1. For example, if the size ratio of the N transistor 40 is 1 as well as the conventional transistor, the size ratio γ of the P transistor 38 is less than 1 such as 0.3–0.5. The size of the P transistor 38 must be same as that of the N transistor 36 provided in the first logic gate 14-1. In the second logic gate 14-2 including the smaller P transistor 38 and the larger N transistor 40, the N transistor 40 is turned on and the P transistor 38 is turned off, simultaneously when the input terminal 32 rises from 0 to 1. Where the size of the P transistor 38 turned off is small in size and its gate capacitance is also small so that the high-speed falling transition from 1 to 0 of the output voltage waveform of the output terminal 44 can be achieved.

Correspondingly, in the first logic gate 14-1, the falling transition of the output voltage waveform takes long time contrary to the above mentioned high-speed rising transition of the output when the N transistor 36 is turned on and the P transistor 34 is turned off according to the input rises from 0 to 1. Also in the second logic gate 14-2 as well as the first logic gate 14-1, the rising transition of the output voltage waveform takes long time contrary to the high-speed falling transition of the output when the P transistor 38 is turned on and the P transistor 40 is turned off according to the input falls from 1 to 0.

The two-wire inverter 16 followed by the two-wire inverter 14 has a first logic gate 16-1 and a second logic gate 16-2. Its circuit configuration is same as the first logic gate 14-1 and the second logic gate 14-2 of the two-wire inverter 14. That is to say, in the first logic gate 16-1, the output rapidly rises from 0 to 1 responsive to the falling transition from 1 to 0 of the input. Alternatively, in the second logic gate 16-2, the output rapidly falls from 0 to 1 responsive to the rising transition from 0 to 1 of the input. Since the rising transition time of the output voltage waveform at the first logic gate 14-1 of the front two-wire inverter 14 is speeded up, the output terminal 42 of the first logic gate 14-1 is connected to the input terminal 48 of the second logic gate 16-2 of the subsequent two-wire inverter 16 thereby the falling transition time of the output voltage waveform is speeded up in the second logic gate 16-2 to output. In the same way, the output whose falling transition time of the output voltage waveform is speeded up from the second logic gate 14-2 of the two-wire inverter 14 is connected to the input terminal 46 of the first logic gate 16-1 of the two-wire inverter 16 thereby the rising transition time of the output voltage waveform is speeded up in the first logic gate 16-1 to output. Incidentally, the two wire inverter 14 and 16 are provided in two-stage followed by the input separator circuit 12 in the present embodiment, however the number of stages in the inverter chain can be selected from any plural numbers according to need. Additionally, the input/output connection between each inverter of the inverter chain is connected such that the output of the front first logic gate is connected to the input of the subsequent second logic gate, and the output of the front second logic gate is cross-connected to the input of the subsequent first logic gate.

Figure 4A:
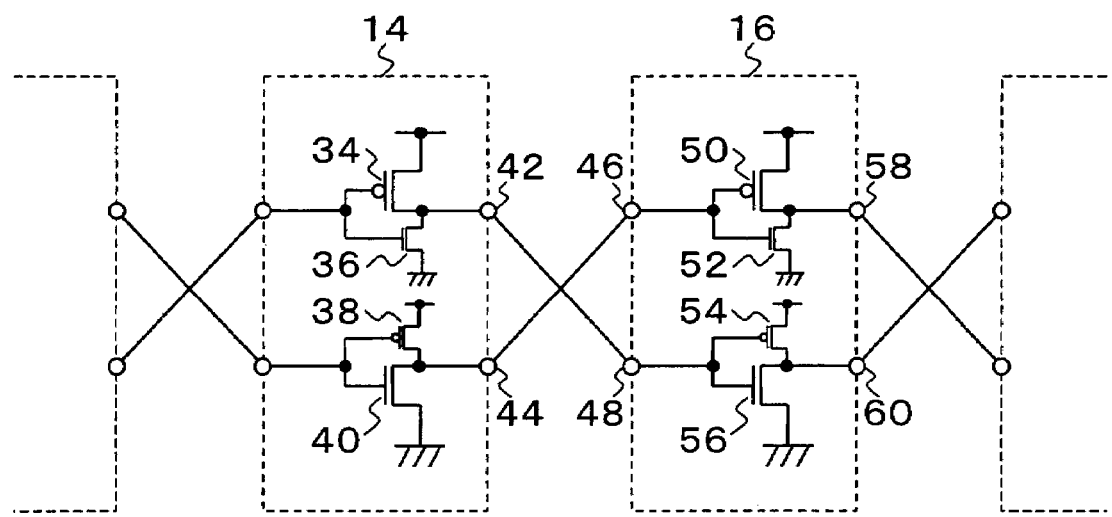
FIGS. 4A–4B are circuit diagrams of the inverter chain of FIG. 3.
Figure 4B:
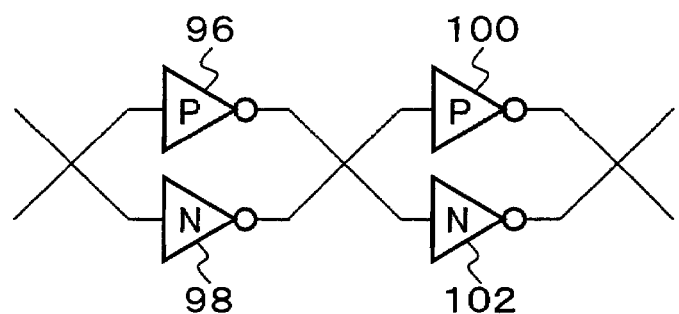

FIG. 4A is a circuit diagram of the two-wire inverter 14 and 16 of FIG. 3. FIG. 4B represents the two-wire inverter 14 and 16 of FIG. 4A in circuit codes as inverter 96 and 100 in which the rising transition time of the output voltage waveform is speeded up, and inverter 98 and 102 in which the falling transition time of the output voltage waveform is speeded up.

Next, the output converter circuit 18 of FIG. 3 is described. The output converter circuit 18 inputs in parallel two signals E3 and E5 outputted from the two-wire inverter 16 and converts them into one signal E6 for the single-wire inverter 20.

Figure 5:
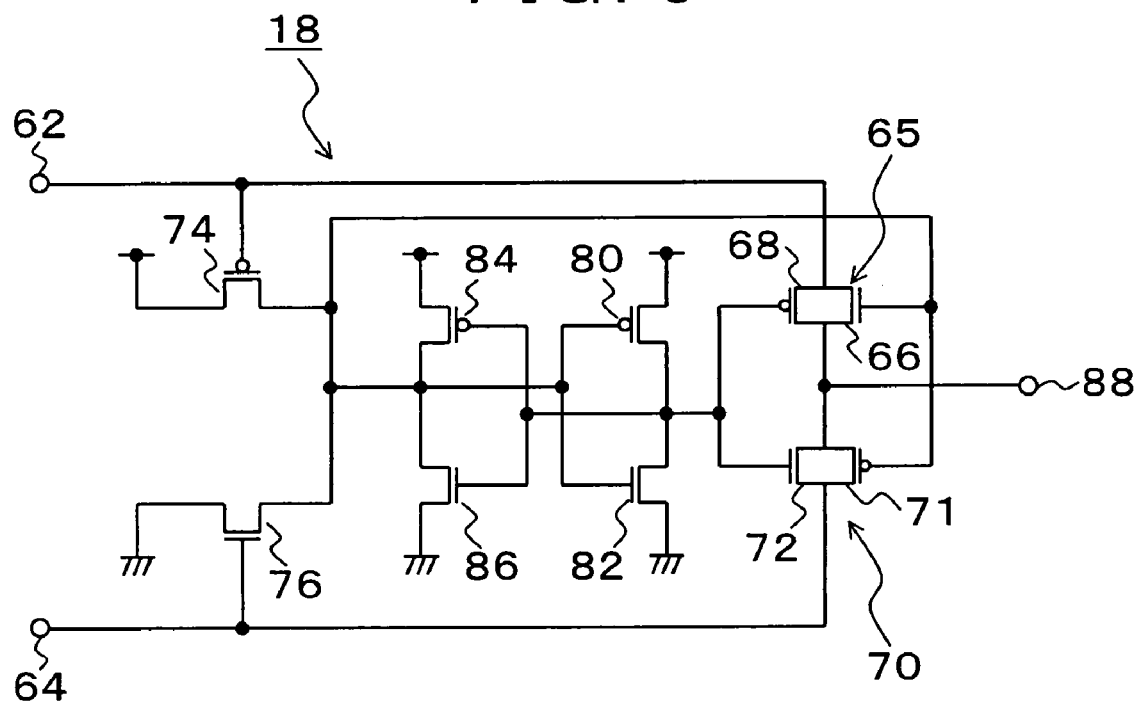
FIG. 5 is a circuit diagram of the output converter circuit of FIG. 3.

FIG. 5 is a circuit diagram of the output converter circuit 18 of FIG. 3. The output converter circuit 18 includes an input terminal 62 and an input terminal 64 in FIG. 5. The input terminal 62 is inputted the signal E3 speeded up the rising transition time thereof from the front two-wire inverter 16. The input terminal 64 is inputted the signal E5 speeded up the falling transition time thereof. The input terminal 62 is connected to an output terminal 88 through a transfer gate 65 in which a N transistor 66 and a P transistor 68 are connected in parallel. The input terminal 64 is connected to the output terminal 88 through a transfer gate 70 in which P transistor 71 and a N transistor 72 are connected in parallel. The transfer gate 65 and 70 are controlled to open/close by a control circuit including P transistor 74, 80 and 84 and N transistor 76, 82 and 86.

FIG. 6 represents in chronological order the operation of the output converter 18 in which the input signal E3 rises at a high speed and the input signal E5 rises at a low speed. Where, the transistors surrounded by the broken line are turn on, the other transistors are turned off. When the input signal E3 for the input terminal 62 rises from 0 to 1 at a high speed, the input signal E5 for the input terminal 64 rises from 0 to 1 at a low speed. Accordingly, the level change of the rising of the input signal E3 and E5 is distinguished as the following three states;

E3=0, 1, 0
E5=0, 0, 1

Figure 6A:
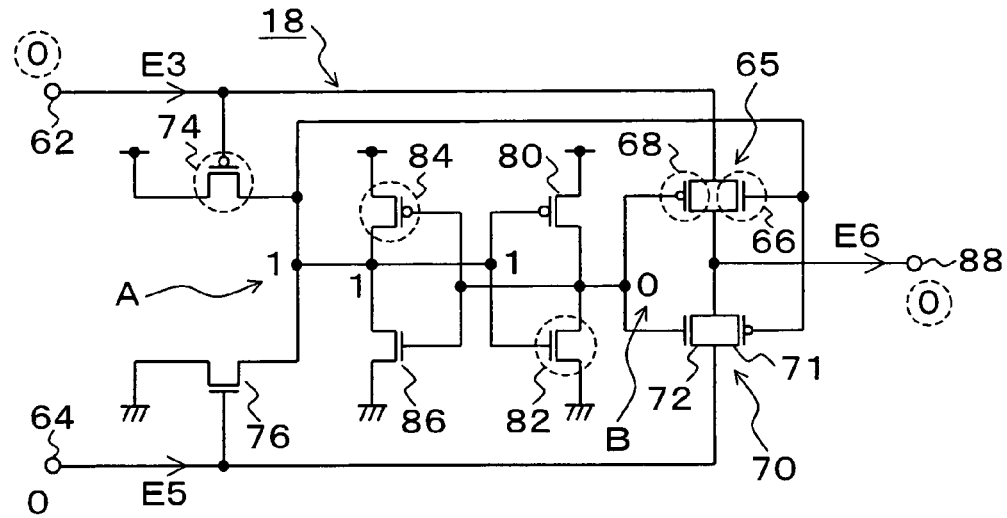
FIGS. 6A–6C are circuit diagrams of the operation of the output converter circuit to pick up the edge of high-speed rising transition.

In FIG. 6A, both of the input signal E3 and E5 are 0. The P transistor 74 is turned on according to the input signal E3=0, correspondingly, the N transistor 76 is turned off according to the input signal E5=0, and A point as a gate for one of the transfer gate 65 or the transfer gate 70 is 1. Thereby the N transistor 66 of the transfer gate 65 is turned on and the P transistor 71 of the transfer gate 70 is turned off. Additionally, according to the A point is 1, the gate input for the P transistor 80 and the N transistor 82 is 1 so that the P transistor 80 is turned off and the N transistor 82 is turned on. When the N transistor 82 is turned on, B point as a gate for the other of the transfer gate 65 and the transfer gate 70 is 0 so that the P transistor 66 is turned on and the N transistor 72 is turned off. Thereby the transfer gate 65 is opened according to the N transistor 66 and the P transistor are turned on while the transfer gate 70 is closed. Further, the gate input of the P transistor 84 and the N transistor 86 is 0 according to the B point is 0. Thereby a latching operation to keep the state that the N transistor 82 and the P transistor 84 are turned on and the P transistor 80 and the N transistor 86 are turned off is performed regardless of the state of the A point.

Figure 6B:
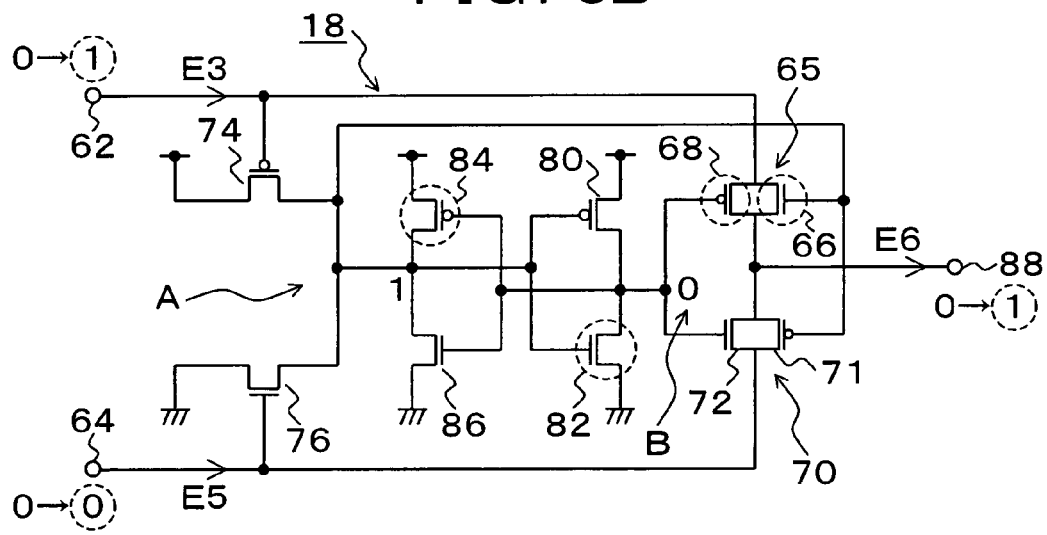

Next, when the input signal E3 rises from 0–1 as FIG. 6B, the input signal E5 remains in 0 because it rises at a low speed. At this time, since the transfer gate 65 is opened, the change of the voltage waveform of the rising edge at which the input signal E3 rises from 0 to 1 is transferred to the output terminal 88 through the transfer gate 65 so that an output signal E6 of the output terminal 88 rises from 0 to 1 at a high speed. Meanwhile, the P transistor 74 in on-state is turned off according to the input signal E3 transfers from 0 to 1. At this time, the A point is kept 1 and the B point is kept 0 even if the P transistor 74 is turned off because the latching operation is performed according to the P transistor 84 is turned on. Therefore, the N transistor 66 and the P transistor 68 of the transfer gate 65 are kept on-state.

Figure 6C:
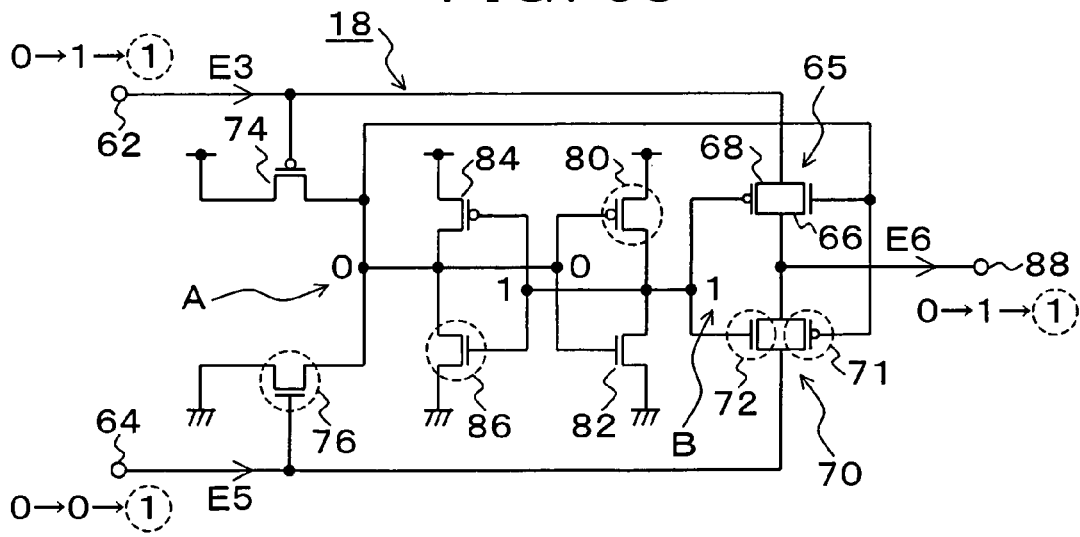

Next, the input signal E5 rises from 0 to 1 followed that the input signal E3 rose to 1 as FIG. 6C. The N transistor 76 is turned on according to the input signal E5=1, correspondingly the P transistor 74 is turned off according to the input signal E3=1 so that A point as a gate for one of the transfer gate 65 and the transfer gate 70 is 0. Thereby the N transistor 66 of the transfer gate 65 is turned off and the P transistor 71 of the transfer gate 70 is turned on. Additionally, the gate input for the P transistor 80 and the N transistor 82 is 0 according to the A point is 0 so that the P transistor 80 is turned on and the N transistor 82 is turned off. When the P transistor 80 is turned on, the B point as the gate for the other of the transfer gate 65 and the transfer gate 70 is 1 so that the P transistor 68 is turned off and the N transistor 72 is turned on. Thereby the transfer gate 70 is opened according to the P transistor 71 and the N transistor 72 are turned on while the transfer gate 65 is closed. Further, according to the B point is 1, the gate input for the P transistor 84 and the N transistor 86 is 0 so that the P transistor 84 is turned off and the N transistor 86 is turned on. Thereby a latching operation to keep the state that the P transistor 80 and the N transistor 86 are turned on and the N transistor 82 and the P transistor 84 are turned off is performed regardless of the state of the A point. That is to say, the transfer gate 65 to output 1 to the output terminal 88 is closed, and alternatively, the transfer gate 70 is opened to output 1.

FIG. 7 represents in chronological order the operation of the output converter circuit 18 in which the input signal E5 for the input terminal 64 falls at a high speed and the input signal E3 for the input terminal 62 falls at a low speed, simultaneously.

Accordingly, the change of signal state at which the input signal E3 and E5 falls is distinguished as the following three states;

E3=1, 1, 0
E5=1, 0, 0

Where the input signal E5 falls at a high speed, subsequently, the input signal E3 falls.

Figure 7A:
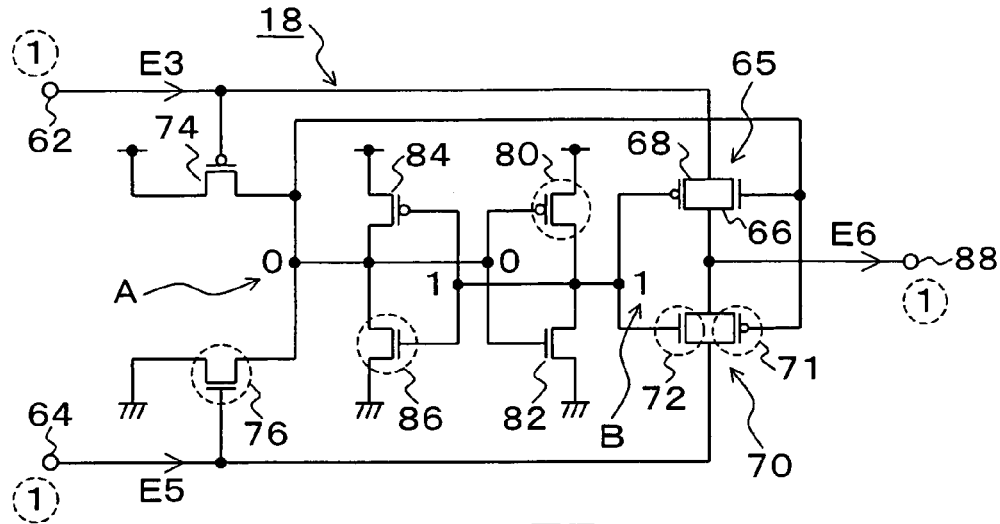
FIGS. 7A–7C are circuit diagrams of the operation of the output converter circuit to pick up the edge of high-speed falling transition.

FIG. 7A represents the operation in the state that both of the signal E3 and the signal E5 are 1 before falling. This state is same as FIG. 6C. That is to say, the N transistor 76, the P transistor 80 and N transistor 86 in the control circuit are turned on according to both of the signal E3 and the signal E5 are 1, the P transistor 71 of the transfer gate 70 is turned on according to the A point is 0, and the N transistor 71 of the transfer gate 70 is turned on according to the B point is 1 so that the transfer gate 70 is opened.

Figure 7B:
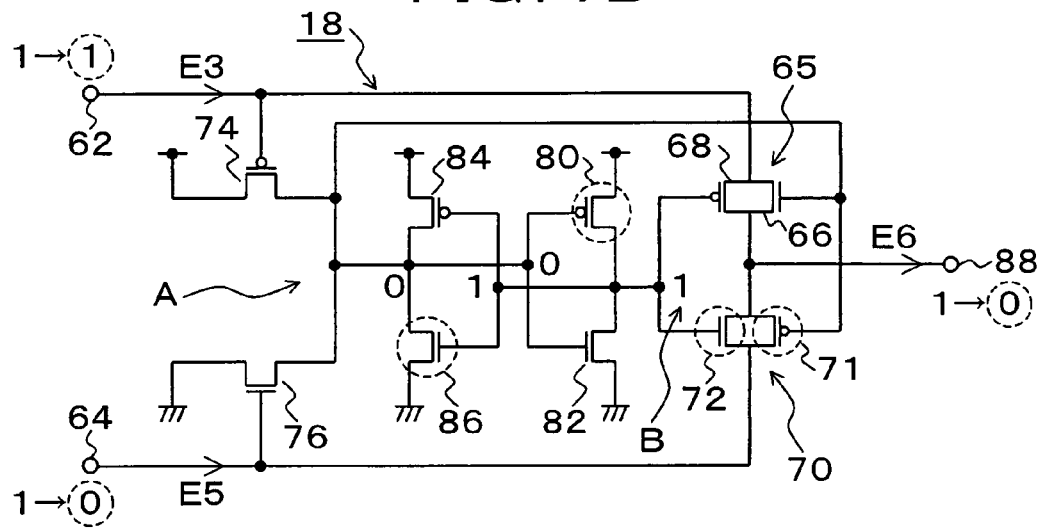

In the above described state, when the input signal E5 rapidly falls from 1 to 0 as FIG. 7B, the falling edge is transferred to the output terminal 88 through the opening transfer gate 70 so that the signal E6 rapidly falls from 1 to 0. At this time, the N transistor 76 is turned off according to the signal E5 falls to 0 while the A point is kept 0 and the B point is kept 1 by the latching operation according to the P transistor 80 and the N transistor 86 are turned on so that the P transistor 71 and the N transistor 72 of the transfer gate 70 are kept on-state thereby the transfer gate 70 is kept to be opened.

Figure 7C:
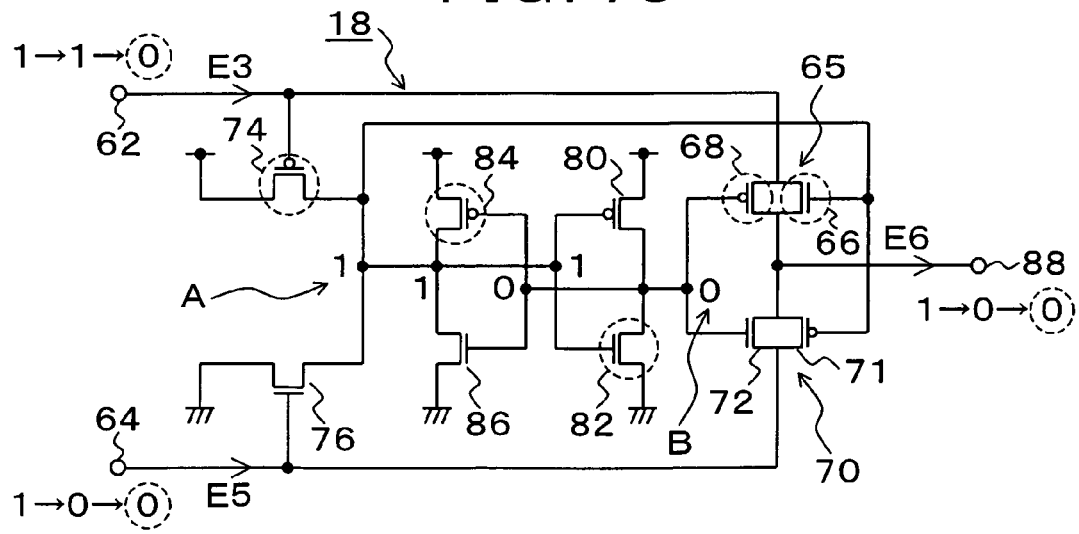

Next, when the input signal E5 rapidly falls to 0 as FIG. 7C, subsequently the input signal E3 falls from 1 to 0, the A point is 1 according to the P transistor 74 is turned on thereby the B point is 0 according to the N transistor 82 is turned on, and the P transistor 84 is turned on according to the point is 0 so that the A point is latched onto 1. In this state, the N transistor 66 of the transfer gate 65 is turned on according to the A point is 1 and the P transistor 68 is turned on according to the B point is 0 thereby the transfer gate 65 is opened. This state of FIG. 7C is same as FIG. 6A. Accordingly, when the input signal E3 speeded up the rising thereof and the input signal E5 speeded up the falling thereof are inputted into the input terminal 62 and the input terminal 64 in parallel, the operations of FIG. 6A, FIG. 6B, FIG. 6C and FIG. 7B are repeatedly performed in the output converter circuit 18 of FIG. 5 according to the present invention.

FIG. 8 is a time chart of the signal waveforms of the input signal E1 inputted into the input separator circuit 12, the output signal E2 and E4 outputted from the two-wire inverter 14, the output signal E3 and E5 outputted from the two-wire inverter 16 and the output signal E6 outputted from the output converter circuit 18 in the embodiment of FIG. 3.

FIG. 8A is the input signal E1 inputted from the single-wire inverter 10 to the input converter circuit 12. Where, the rising transition time and the falling transition time are same period. The input signal E1 is separated into the two signals by the input separator circuit 12 and inputted them into the first logic gate 14-1 and the second logic gate 14-2 of the two-wire inverter 14 in parallel, respectively. Where, paying attention to the rising edge of the input signal E1, it is rapidly falls at the second logic gate 14-2 and rapidly rises at the subsequent two-wire inverter 16-1 in the waveform. That is to say, the output signal E2 at the second logic gate 14-2 in the two-wire inverter 14 is outputted in the waveform in which the falling is speeded up as FIG. 8B. The output signal E3 at the second logic gate 16-1 in the two-wire inverter 16 is outputted in the wave form in which the rising is speeded up contrary to the input signal E2 as FIG. 8C. Meanwhile at the first logic gate 14-1 in the two-wire inverter 14, the signal E4 speeded up the rising thereof as FIG. 8D contrary to the falling of the input signal E1 is outputted. Subsequently, at the second logic gate 16-2 in the two-wire inverter 16, the signal E5 speeded up the falling thereof as FIG. 8E contrary to the rising of the input signal E4 is outputted. Then, the output converter circuit 18 inputs the signal E3 of FIG. 8C and the signal E5 of FIG. 8E, picks up only the high-speed rising edge of the signal E3 and the high-speed falling edge of the signal E5 and outputs a composite signal whose rising and falling are speeded up. i.e. the signal E6 for the single-wire circuit.

Where, at the rising edge of the input signal E1 of FIGS. 8A, 8B, 8C and 8F, each passing delay $T_{pd1}$, $T_{pd2}$ and $T_{pd3}$ through the signal E1, E2, E3 and E6 is shorter because the P transistor and N transistor whose size are different from each other in the two-wire inverter 14 and 16 according to the present invention are complementarily connected to reduce the whole capacitance. At the falling edge of the input signal E1 of FIGS. 8D, 8E and 8F, each passing delay $T_{pd4}$, $T_{pd5}$ and $T_{pd6}$ through the signal E4, E5 and E6 is shorter in the same way.

Figure 9:
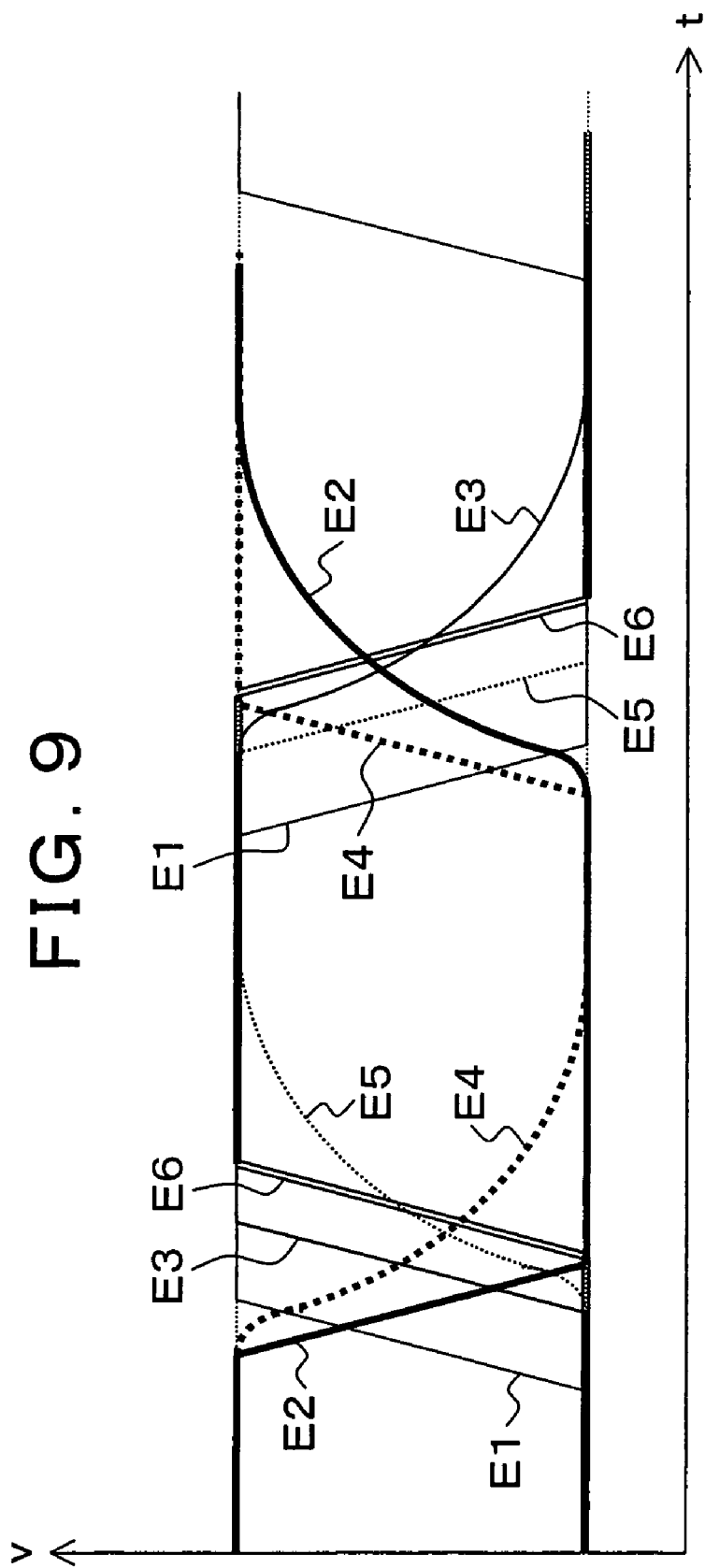
FIG. 9 is a time chart superimposed the voltage signal waveform of each unit of FIG. 8.

FIG. 9 is a time chart superimposed the signal E1-E6 of FIG. A-F on one time base. FIG. 9 facilitates to understand the timing relation between the signal E1-E6.

Next, the effect of the shortened passing delay in the two-wire transmitter circuit according to the present invention is described with reference to an inverter chain in which a plurality of two-wire inverter 14 and 16 of FIG. 3 are connected for example in comparison with the conventional CMOS inverter. As described before, if each size ratio of the P transistor and the N transistor of the conventional inverter is 1, either of the N transistor or the P transistor of the two-wire inverter according to the present invention is downsized and the size ratio is γ less than 1. Accordingly, if the total size of the transistors of the conventional CMOS inverter is 1, the total size of the transistors of the two-wire inverter according to the present invention is (1+γ). Where, if it is assumed that γ=1, the size of the transistors is 2 and it is equivalent to double conventional CMOS inverter chains.

The passing delay $T_{pd}$ of the gate in the inverter chain using the CMOS transistor is expressed by the above mentioned formula (2). If the present invention applied to the whole transmitter circuit with the inverter chain, the reduction effect of the gate capacitance $C_1$ of the drive gate also affects on the number of fan-out n of the load gate. Accordingly high-speed transmission by speeding up the rising and the falling is expected in a circuit having the large number of fan-out n. Thus the sensitivity to the number of fan-out n is subjected to compare. Additionally, the two-wire inverter chain according to the present invention does not particularly effect on the wiring load capacitance and it seems that the effect of the speeding up is reduced in proportion as the wire length is longer. Therefore the sensitivity to the wire length is also subjected to compare. Where, the following conditions are provided in the comparison;

(1) The number of the gate stages of the conventional CMOS inverter chain is 11. The gate stages of the two-wire inverter chain according to the present invention is provided such that the conventional single-wire inverter 10 is provided, subsequently, ten stages of two-wire inverter chain are provided and the output converter circuit 18 is provided thereto.
(2) The wire length is 10, 20, 50 and 100 grid.
(3) The number of fan-out n is 1, 2, 4 and 8.
(4) The size γ is selected from three number of 0.3, 0.4 and 0.5.

FIG. 10 is an explanatory view of the passing delay $T_{pd}$ by the result of the simulation for the conventional circuit and the new circuit according to the present invention based on the above mentioned condition (1)–(4). Where, the number of fan-out n 1, 2, 4 and 8 are indicated on the columns and values of the passing delay in the conventional circuit and the present circuit for each 10, 20, 50 and 100 grid on the rows. The size of the transistor of the conventional circuit is 1 and 2, correspondingly, the size of the transistor of the present circuit are 1.5 for $\gamma=0.5$, 1.4 for $\gamma=0.4$ and 1.3 for $\gamma=0.3$, respectively.

Figure 11:
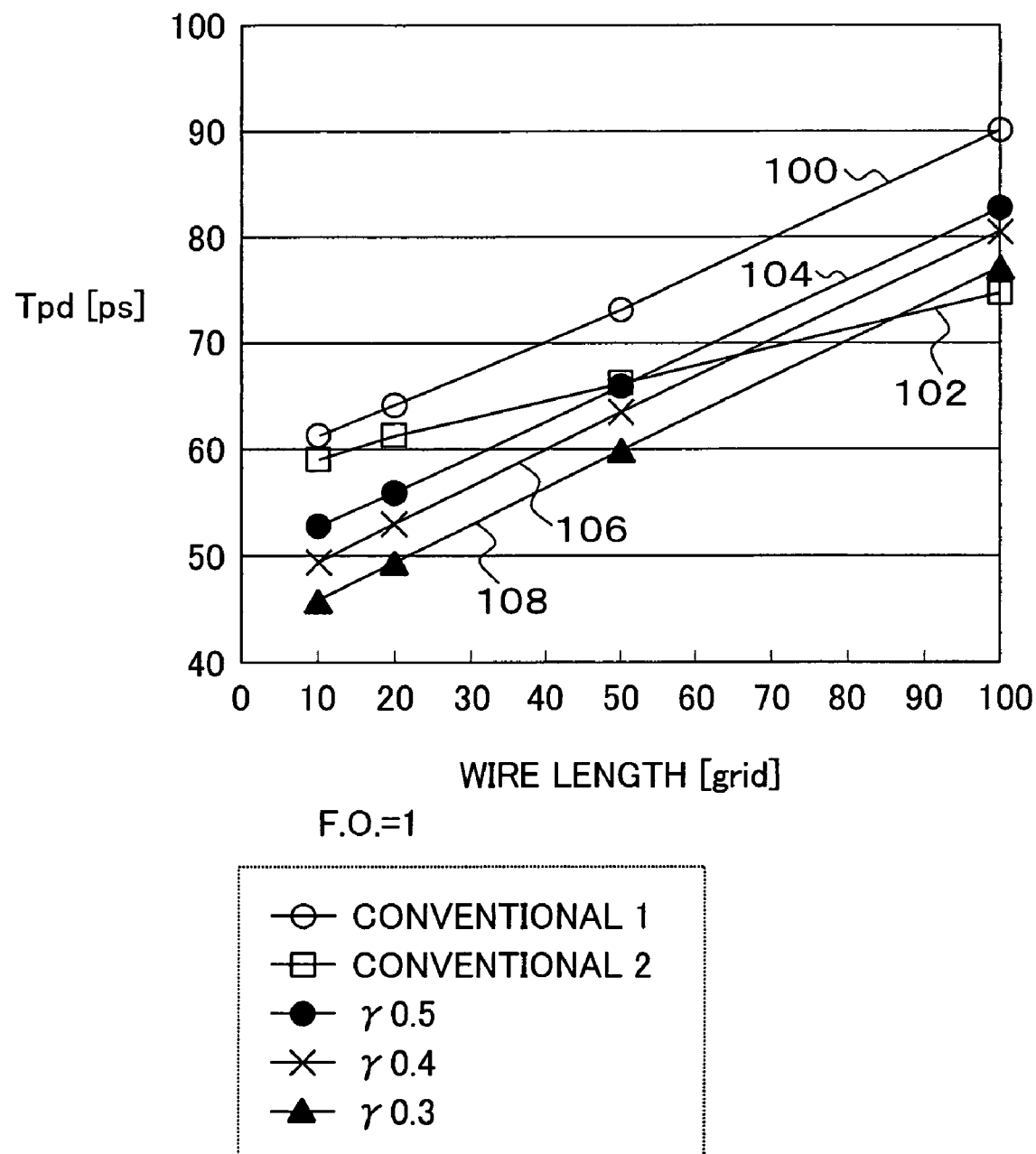
FIG. 11 is a graphical diagram representing the passing delay according to the present invention relative to the wire length when the number of fan-out is fixed to 1 based on FIG. 10 in contradistinction to the conventional circuit.

FIG. 11 is a graphical diagram of the relationship between the passing delay $T_{pd}$ and the wire length based on the result of the simulation of FIG. 10. Where, the number of fan-out n is fixed to 1. A characteristic 100 represents when the size of the transistor is 1 in the conventional circuit. A characteristic 102 represents when the size of the transistor is 2 in the conventional circuit. Correspondingly, a characteristic 104 represents when $\gamma=0.5$ in the present circuit, a characteristic 106 represents when $\gamma=0.4$ in the present circuit and a characteristic 108 represents when $\gamma=0.3$ in the present circuit. The present circuit having the characteristic 104 whose $\gamma=0.5$ as FIG. 11 is speeded up 10% than the conventional circuit having the characteristic 100 whose size is 1. Additionally, within the wire length is less than 50 grid, the present circuit having the characteristic 104 whose $\gamma=0.5$ is speeded up than the conventional circuit having the characteristic 102 whose size is 2. In the conventional circuit, if the transistor is larger in size, the passing delay $T_{pd}$ is reduced to be speeded up, alternatively in the present circuit, if the transistor is smaller in size, the passing delay $T_{pd}$ is reduced to be speeded up. This fact means that $\gamma=1$ of the present circuit corresponds to the conventional circuit having the characteristic 100 whose size is 1 and the $\gamma$ is reduced therefrom to be speeded up. Additionally, in case of a multistage circuit having multiple load wire length, $\gamma$ is set to 1 for the long wire thereby it is prevented from slowing down than the conventional circuit.

FIG. 12 is a graphical diagram of the change of the passing delay $T_{pd}$ relative to the number of fan-out n in comparison between the conventional circuit and the present circuit when the wire length is fixed to 100 grid based on FIG. 10. In FIG. 12, a characteristic 110 represents when the size of the transistor is 1 in the conventional circuit and a characteristic 112 represents when the size of the transistor is 2 in the conventional circuit. Correspondingly, a characteristic 114 represents when $\gamma=0.5$ in the present circuit, a characteristic 116 represents when $\gamma=0.4$ in the present circuit and a characteristic 118 represents when $\gamma=0.3$ in the present circuit. According to the graph of FIG. 12, the present circuit having the characteristic 114 whose $\gamma=0.5$ is speeded up than the conventional circuit having the characteristic 110 whose size is 1. The ratio of the speeding up is just 8% when the number of fan-out is 1, and it is improved to 18% when the number of fan-out is 8. Additionally, comparing with the conventional circuit having the characteristic 112 whose, transistor size is 2, the present circuit having the characteristic 114 whose $\gamma=0.5$ is slowed than the conventional circuit if the wire length is above 50 grid in the state that the number of fan-out is 1 based on the result of the comparison of the sensibility to the wire length in FIG. 11. Meanwhile in case of the wire length is 100 grid as FIG. 12, the present circuit having the characteristic 114 whose $\gamma=0.5$ forereaches the conventional circuit having the characteristic 112 whose size is 2 in the vicinity of the point at which the number of fan-out is 3. This fact is seemed to demonstrate that the larger the number of fan-out is, the larger the advantage brought by speeding up in the present circuit is.

Now, the restrictions to limit the speeding up in the present circuit is described. In case of $\gamma$ is small in the gate, the waveform can not reach the ground level or the source voltage level by the timing of the next high-speed transition when the low-speed edge contrary to the high-speed edge transfers thereby an malfunction may occur. Thus the limit of the speeding up is changed depending on the load condition of the wire length and the fan-out.

Therefore, in the high-speed transmitter circuit according to the present invention, either of the rising transition time or the falling transition time of the output voltage waveform is speeded up so that the gate in which the parasitic capacitance is reduced can be achieved. Additionally, the two-wire circuit using a gate for speeding up the rising and a gate for speeding up the falling in pairs is adopted so that a high-speed transmitter circuit than the conventional circuit can be achieved. The rate of the speeding up is changed depending on the load wire length and the number of fan-out. If the wire length is short, the size of the transistor is enlarged by about 1.5 times instead of the size of the transistor of the conventional circuit is enlarged twice so that it can be speeded up. Additionally, the conventional circuit and the two-wire transmitter circuit according to the present invention may be combined. In this case, the present invention may be applied to the single-wire CMOS circuit to be speeded up without changing the technology and the logic.

Next, the correspondence of the basic gate circuit to transform the conventional circuit into the high-speed transmitter circuit according to the present inventions described.

Figure 13A:
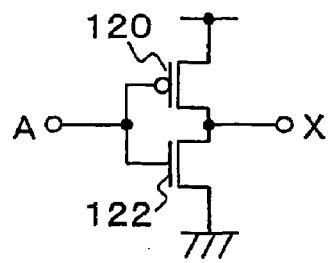
FIGS. 13A–13B are circuit diagrams of an example of the application to the inverter gate.
Figure 13B:
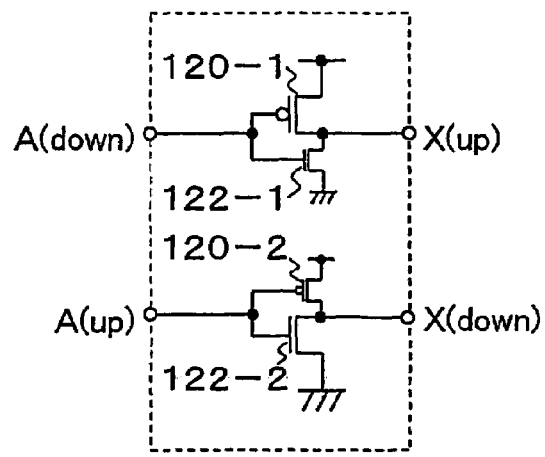

FIG. 13 represents the correspondence between the conventional circuit and the present new circuit with respect to the inverter. FIG. 13A is the conventional inverter including a P transistor 120 and a N transistor 122 whose size is about P/N=2. FIG. 13B is the two-wire inverter according to the present invention whose transistor size is about P/N=2 as well as the conventional inverter. A logic gate for the high-speed rising output X(up) is composed of a P transistor 120-1 whose size is 1 and a N transistor 122-1 whose size is $\gamma$ smaller than 1. Correspondingly a logic gate for the high-speed falling output X(down) is composed of a P transistor 120-2 whose size is $\gamma$ and a N transistor 122-2 whose size is 1. Where, the size ratio $\gamma$ of the N transistor 122-1 is associated with the N transistor 122-2, and the size ratio $\gamma$ of the P transistor 120-2 is associated with the P transistor 120-1.

Figure 14A:
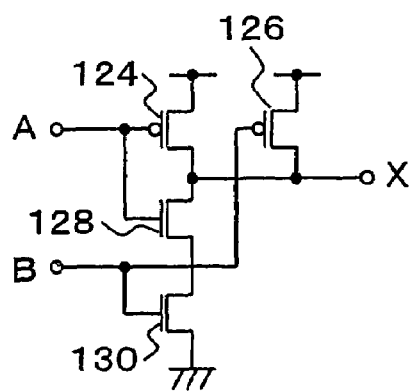
FIGS. 14A–14B are circuit diagrams of an example of the application to the NAND gate.
Figure 14B:
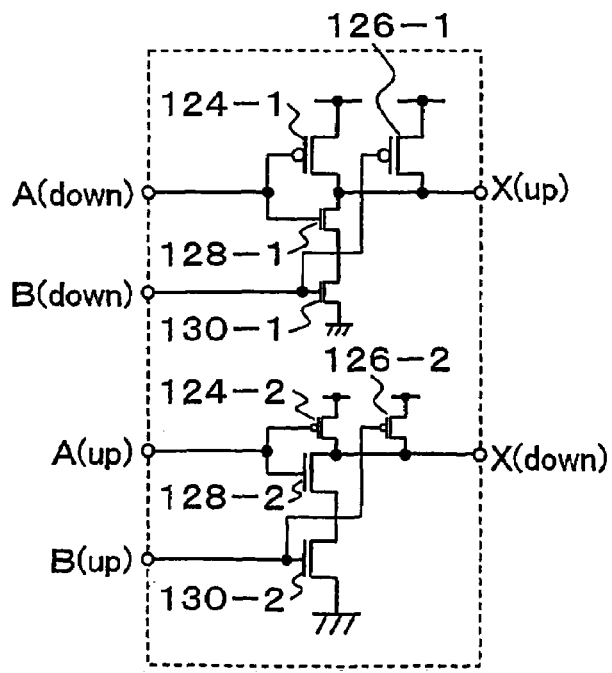

FIG. 14 represents the conventional circuit and the present circuit with respect to a NAND gate. The conventional NAND gate of FIG. 14A is composed of P transistor 124 and 126 and N transistor 128 and 130 whose size is about P/N=2. Correspondingly the two wire NAND gate according to the present invention of FIG. 14B is provided with two circuits having the same configuration as the FIG. 14A. Among the P transistor 124-1 and 126-1 and the N transistor 128-1 and 130-1 constituting the circuit for the high-speed rising output X(up), the N transistor 128-1 and 130-1 are downsized as $\gamma$. The circuit for the high-speed falling output X(down) is composed of P transistor 124-2 and 126-2 and N transistor 128-2 and 130-2. Among them, the P transistor 124-2 and 126-2 are downsized as $\gamma$.

Figure 15A:
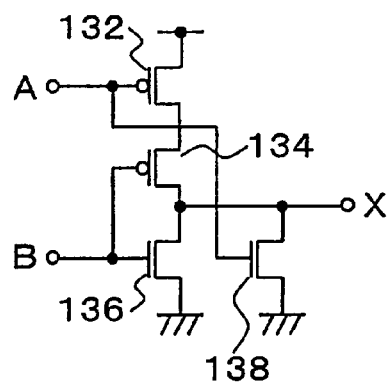
FIGS. 15A–15B are circuit diagrams of an example of the application to the NOR gate.
Figure 15B:
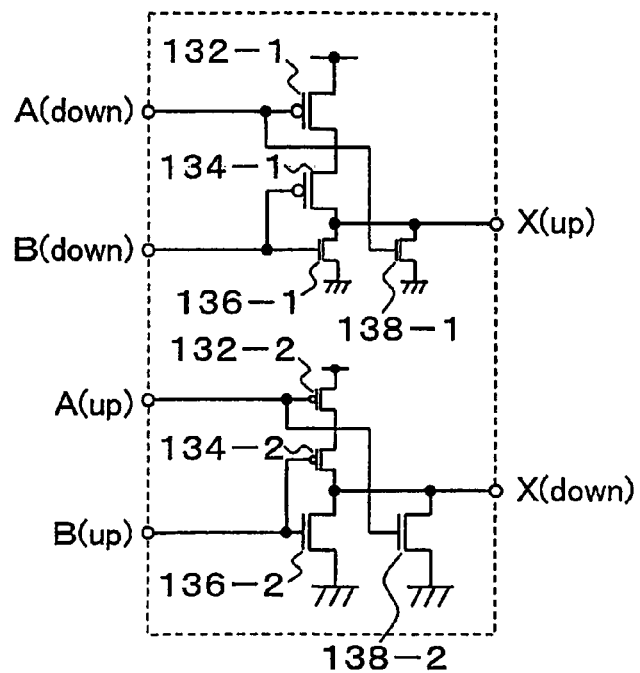
Figure 16A:
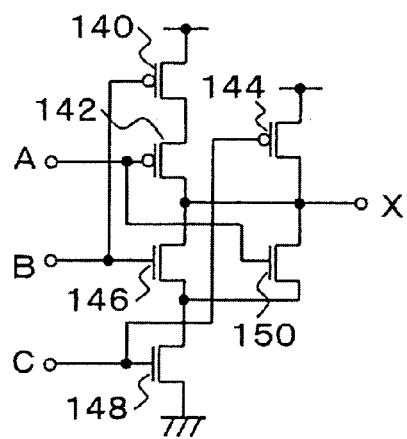
FIGS. 16A–16B are circuit diagrams of an example of the application to the composite gate including AND, OR and an inverter.
Figure 16B:
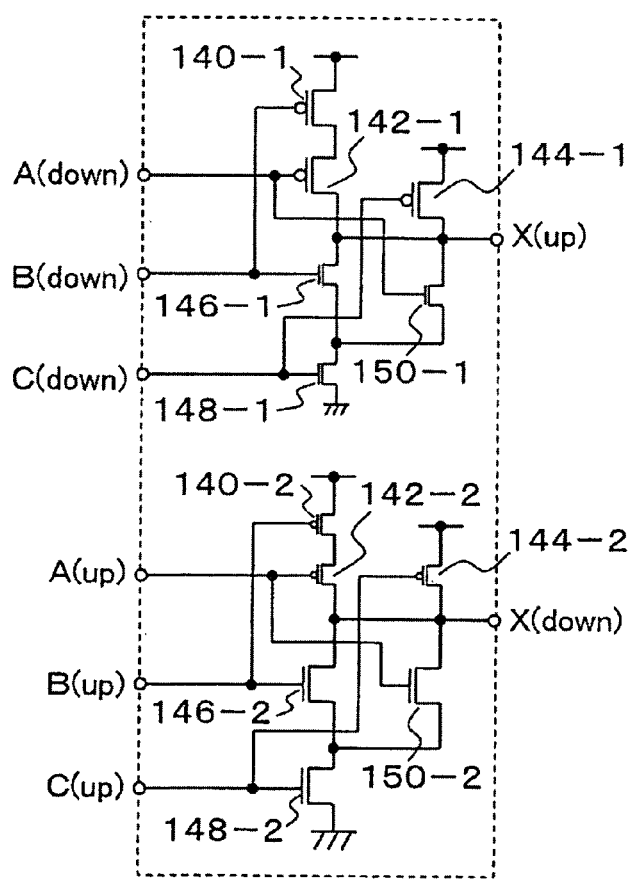

FIG. 15 represents the conventional circuit and the present circuit with respect to a NOR gate. The conventional NOR gate of FIG. 15A is composed of P transistor 132 and 134 and N transistor 136 and 138 whose size is about P/N=2. Correspondingly the two wire NOR gate according to the present invention of FIG. 15B is provided with two gate circuits having the same configuration as the conventional circuit. The NOR gate for the high-speed rising output X(up) is composed of P transistor 132-1 and 134-1 and the N transistor 136-1 and 138-1. Among them, the N transistor 136-1 and 138-1 are downsized as γ. Correspondingly the NOR gate for the high-speed falling output X(down) is composed of P transistor 132-2 and 134-2 and N transistor 136-2 and 138-2. Among them, the P transistor 132-2 and 134-2 are downsized as γ. FIG. 16 represents the conventional circuit and the present circuit of a composite gate including an AND gate, an OR gate and an inverter. FIG. 16A is the conventional circuit composed of P transistor 140, 142 and 144 and N transistor 146, 148 and 150. The picked up output X is an inverting output of (A and B) or C. FIG. 16B is the two-wire composite gate corresponding the conventional circuit, which includes two circuits, one of which is a composite gate to pick up a high-speed rising output X(up) and the other of which is a composite gate to pick up a high-speed falling output X(down). Each of the circuit configuration is same as the conventional circuit of FIG. 16A. Where, a N transistor 146-1, 148-1 and 150-1 in the upper composite gate are downsized to γ, a P transistor 140-2, 142-2 and 144-2 in the lower composite gate are downsized to γ and the size of the other transistors is same as that of the conventional transistors.

FIG. 17 represents the conventional circuit and the present circuit with respect to a composite gate combined an OR gate, an AND gate and an inverter. The composite gate of FIG. 17A is composed of P transistor 152, 154 and 156 and N transistor 158, 160 and 162. The picked up output X is the inverting output of (A or B) and C. FIG. 17B is the present circuit corresponding to the composite gate of FIG. 17A, which includes two circuits, one of which is a composite gate for a high-speed rising output X(up) and the other of which is a composite gate for a high-speed falling output X(down). Each of the circuit configuration is same as the conventional circuit of FIG. 17A. Where, a N transistor 158-1, 160-1 and 162-1 in the upper composite gate are downsized as γ, and a P transistor 152-2, 154-2 and 156-2 in the lower composite gate are downsized as γ.

Figure 18A:
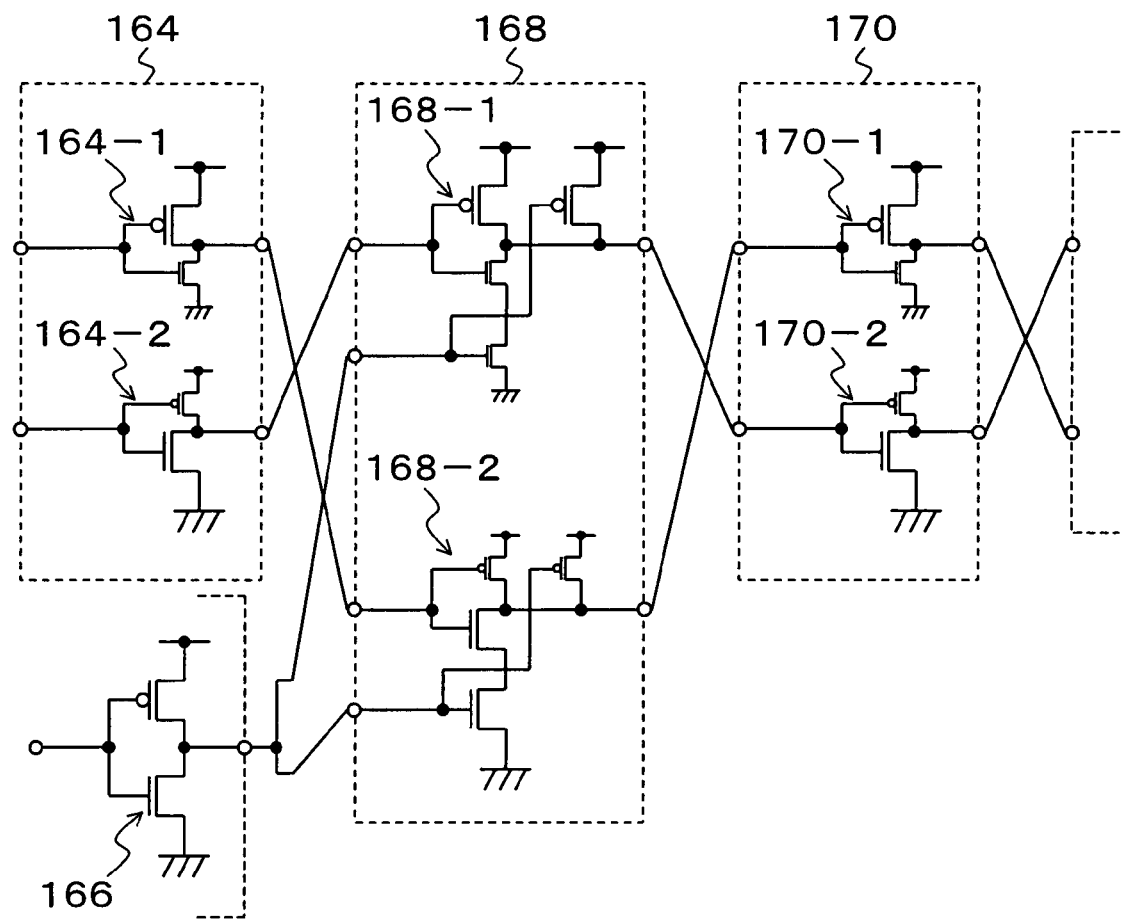
FIGS. 18A–18B are circuit diagrams of an example of the application to the general CMOS circuit.
Figure 18B:
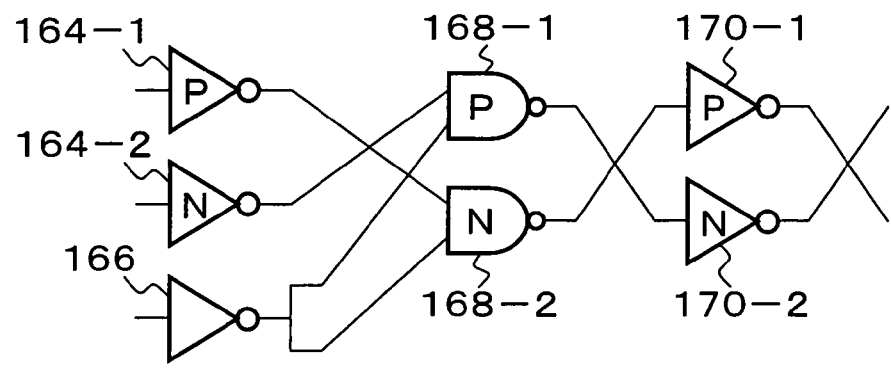

Further, FIG. 18 is an example that the two-wire circuit according to the present invention is applied to a general CMOS circuit. FIG. 18A is a transmitter circuit applied the present invention, which includes a two-wire inverter 164, a two-wire NAND gate 168 and a two-wire inverter 170. The middle two-wire NAND gate 168 is inputted the separated inputs from the conventional inverter 166. In other words, the two-wire inverter 164 and 170 includes a first inverter 164-1 and 170-1 to pick up high-speed rising outputs and a second inverter 164-2 and 170-2 to pick up high-speed falling outputs. The two-wire NAND gate 168 includes a first NAND gate 168-1 to pick up high-speed rising and a second NAND gate 168-2 to pick up high-speed falling. FIG. 18B represents the high-speed transmitter circuit of FIG. 18A in circuit codes. Where, one of the two-wire gate is composed of the first inverter 164-1 for the high-speed rising output, the second NAND gate 168-2 for the high-speed falling output and the first inverter 170-1 for the high-speed rising output. The other of the gate is composed of the second inverter 164-2 for the high-speed rising output, the first NAND gate 168-1 for the high-speed rising output and the second inverter 170-2 for the high-speed falling output. The inputs separated from the output of the conventional inverter 166 are connected to the middle first NAND gate 168-1 and the second NAND gate 168-2 in parallel.

As described above, when the present circuit is applied to the conventional single-wire CMOS circuit, two circuits same as the conventional ones are provided to constitute a two-wire circuit, one of which N transistor is downsized to speed up the rising output thereof and the other of which P transistor is downsized to speed up the falling output thereof so that appropriate conventional CMOS circuits can be transformed into the two-wire high-speed transmitter circuit according to the present invention.

INDUSTRIAL APPLICABILITY

As thus described above, the logic gate composed of the P channel CMOS transistor and N channel CMOS transistor according to the present invention is the two-wire circuit which comprises a pair of the logic gate for the high-speed rising in which the N channel CMOS transistor is downsized and the logic gate for the high-speed falling in which the P channel CMOS transistor is downsized so that the gate capacitance of the transistor parasitized in the gate input unit and the junction capacitance of the transistor parasitized in the gate output unit can be reduced. Additionally, the whole capacitance of the gate can be reduced without changing the load drive capability per wire as the logic gate. Further, the larger transistor is turned on and the smaller transistor is turned off responsive to the change of inputs so that the rising or falling transition of the output voltage waveform is speeded up thereby the high-speed transmission can be achieved when the two-wire logic gates are connected in multistage.

Additionally, the output converter circuit to convert into a signal for the single-wire circuit is provided in the last stage of the two-wire logic gate thereby the two-wire transmitter circuit of the present invention can be appropriately combined with the conventional CMOS circuit to coexist the high-speed transmitter circuit of the present invention according to need.

The invention claimed is:
1. A high-speed transmitter circuit comprising:
an input separator circuit for inputting a signal for a single-wire circuit and separating the signal into two signals;
a two-wire transmitter circuit including at least one pair of logic gates in which a P-channel CMOS transistor and an N-channel CMOS transistor whose size is different from that of the P-channel CMOS transistor are complementarily connected, outputting a first signal speeded up a rising transition time thereof from one of the logic gates and outputting a second signal speeded up a falling transition time thereof from the other of the logic gates; and
an output converter circuit receiving in parallel the first signal and the second signal outputted from the two-wire transmitter circuit and converting the signals into a signal for the single-wire circuit,
the output converter circuit picking up an edge of the rising output signal with speeded-up rising transition time at the first logic gate and an edge of the falling output signal with speeded up falling transition time at the second logic gate, respectively and converting them into a signal for the single-wire circuit, the output converter circuit comprising:
a first transfer gate for passing the rising edge of the output signal with speeded-up rising transition time at the first logic gate to supply it to a single-wire output terminal, a second transfer gate for passing the falling edge of the output signal with speeded-up falling transition time at the second logic gate to supply it to the single-wire output terminal, and a control circuit for repeatedly performing the following:

opening the first transfer gate in the state that the output signals of both of the first logic gate and the second logic gate are logic level 0 and latching the opening state;

supplying the rising edge to a logic level 1 of the output signal of the first logic gate from the opening first transfer gate to the signal-wire output terminal and closing the first transfer gate after a predetermined period;

alternatively opening the second transfer gate to supply a signal at a logic level 1 outputted from the subsequent second logic gate to the signal-wire output terminal;

opening the second transfer gate in the state that the output signals of both of the first logic gate and the second logic gate are logic level 1 and latching the opening state;

supplying the falling edge to a logic level 0 of the output signal of the second logic gate from the opening second transfer gate to the single-wire output terminal and closing the second transfer gate after a predetermined period;

alternatively opening the first transfer gate to supply a signal at a logic level 0 outputted from the subsequent first logic gate to the single-wire output terminal.

2. The high-speed transmitter circuit according to claim 1, wherein the two-wire transmitter circuit comprises a first logic gate in which at least one set of a larger P-channel CMOS transistor and a smaller N-channel CMOS transistor are provided and the rising transition time of an output signal responsive to the change of an input signal is speeded up, and a second logic gate in which at least one set of a smaller P-channel CMOS transistor and a larger N-channel CMOS transistor are provided and the falling transition time of an output signal responsive to the change of an input signal is speeded up.

3. The high-speed transmitter circuit according to claim 2, wherein the size ratio of the smaller one between the P-channel CMOS transistor and the N-channel CMOS transistor is less than 1 if the size of the larger one is 1.

4. The high-speed transmitter circuit according to claim 2, wherein the size ratio between the P-channel CMOS transistor and the N-channel CMOS transistor is 0.3–0.5 if the size of the larger one is 1.

5. The high-speed transmitter circuit according to claim 2, wherein the two-wire transmitter circuit comprises a first inverter in which a larger P-channel CMOS transistor and a smaller N-channel CMOS transistor are complementarily connected and the rising transition time of an output signal responsive to the falling of an input signal is speeded up, and a second inverter in which a smaller P-channel CMOS transistor and a larger N-channel CMOS transistor are complementarily connected and the falling transition time of an output signal responsive to the rising of an input signal is speeded up.

6. The high-speed transmitter circuit according to claim 5, wherein the two-wire inverter is complementarily connected in multistage.

7. The high-speed transmitter circuit according to claim 6, wherein the two-wire inverter is complementarily connected in multistage such that the output of the front first inverter is connected to the input of the subsequent second inverter and the output of the front second inverter is connected to the input of the subsequent first inverter.

8. The high-speed transmitter circuit according to claim 2, wherein the two-wire transmitter circuit is a two-wire AND gate comprises a first AND gate in which the rising transition time of an output signal responsive to the change of a plurality of input signals is speeded up and a second AND gate in which the falling transition time of an output signal responsive to the change of a plurality of input signals is speeded up.

9. The high-speed transmitter circuit according to claim 2, wherein the two-wire transmitter circuit is a two-wire NAND gate comprises a first NAND gate in which the rising transition time of an output signal responsive to the change of a plurality of input signals is speeded up and a second NAND gate in which the falling transition time of an output signal responsive to the change of a plurality of input signals is speeded up.

10. The high-speed transmitter circuit according to claim 2, wherein the two-wire transmitter circuit is a two-wire OR gate comprises a first OR gate in which the rising transition time of an output signal responsive to the change of a plurality of input signals is speeded up and a second OR gate in which the falling transition time of an output signal responsive to the change of a plurality of input signals is speeded up.

11. The high-speed transmitter circuit according to claim 2, wherein the two-wire transmitter circuit is a two-wire NOR gate comprises a first NOR gate in which the rising transition time of an output signal responsive to the change of a plurality of input signals is speeded up and a second NOR gate in which the falling transition time of an output signal responsive to the change of a plurality of input signals is speeded up.

12. A method of high-speed circuit transmission, comprising:

inputting a signal for a single-wire circuit and separating the signal into two signals;

outputting a first signal of which the rising transition time is speeded-up from one of at least a pair of logic gates complementarily connected to a P-channel CMOS transistor and an N-channel CMOS transistor of different sizes, and outputting a second signal of which the falling transition time is speeded-up from the other of said logic gates;

inputting the first signal and the second signal outputted as above in parallel, and converting the signals into a signal for the single-wire circuit, picking up an edge of the rising output signal using the output converter circuit with speeded-up rising transition times at the first logic gate and an edge of the falling output signal with speeded-up falling transition times at the second logic gate, respectively and converting them into a signal for the single-wire circuit, said picking up method including:

passing the rising edge of the output signal using the first transfer gate for speeded-up rising transition times at the first logic gate to supply it to a single-wire output terminal, passing the falling edge of the output signal using the second transfer gate for speeded-up falling transition times at the second logic gate to supply it to the single-wire output terminal, and repeatedly performing the following with a control circuit, including:

opening the first transfer gate in the state that the output signals of both of the first logic gate and the second logic gate are logic level 0 and latching the opening state;

supplying the rising edge to a logic level 1 of the output signal of the first logic gate from the opening first transfer gate to the signal-wire output terminal and closing the first transfer gate after a predetermined period;

opening alternatively the second transfer gate to supply a signal at a logic level 1 outputted from the subsequent second logic gate to the signal-wire output terminal;

opening the second transfer gate in the state that the output signals of both of the first logic gate and the second logic gate are logic level 1 and latching the opening state;

supplying the falling edge to a logic level 0 of the output signal of the second logic gate from the opening second transfer gate to the single-wire output terminal and closing the second transfer gate after a predetermined period;

opening alternatively the first transfer gate to supply a signal at a logic level 0 outputted from the subsequent first logic gate to the single-wire output terminal.

13. A high-speed transmitter circuit comprising:

an input separator circuit for inputting a signal for a single-wire circuit and separating the signal into two signals;

a two-wire transmitter circuit including at least one pair of logic gates in which a P-channel CMOS transistor and a N-channel CMOS transistor whose size is different from that of the P-channel CMOS transistor are complementarily connected, outputting a first signal with a speeded-up rising transition time thereof from one of the logic gates and for outputting a second signal with a speeded up falling transition time thereof from the other of the logic gates; and an output converter circuit receiving in parallel the first signal and the second signal outputted from the two-wire transmitter circuit and converting the signals into a signal for the single-wire circuit, wherein the two-wire transmitter circuit comprises:

a first logic gate in which at least one set of a larger P-channel CMOS transistor and a smaller N-channel CMOS transistor are provided and the rising transition time of an output signal responsive to the change of an input signal is speeded up, and a second logic gate in which at least one set of a smaller P-channel CMOS transistor and a larger N-channel CMOS transistor are provided and the falling transition time of an output signal responsive to the change of an input signal is speeded up, wherein the two-wire transmitter circuit is a two-wire OR or NOR gate comprises:

a first OR or NOR gate in which the rising transition time of an output signal responsive to the change of a plurality of input signals is speeded up, and a second OR or NOR gate in which the falling transition time of an output signal responsive to the change of a plurality of input signals is speeded up.

14. A high-speed transmitter circuit comprising:

at least one set of logic gates in which a P-channel CMOS transistor and a N-channel CMOS transistor whose size is different from that of the P-channel CMOS transistor are complementarily connected, wherein one of the logic gates outputs a first signal speeded up the rising transition time thereof and the other of the logic gates outputs a second signal speeded up the falling transition time thereof, wherein the at least one set of the logic gates comprises:

a first logic gate in which at least one set of a larger P-channel CMOS transistor and a smaller N-channel CMOS transistor are provided and the rising transition time of an output signal responsive to the change of a input signal is speeded up, and a second logic gate in which at least one set of a smaller P-channel CMOS transistor and a larger N-channel CMOS transistor are provided and the falling transition time of an output signal responsive to the change of a input signal is speeded up, and wherein the one set of logic gates is a two-wire NOR gate further comprising:

an output converter circuit for inputting in parallel the first and second signal outputted from the two-wire transmitter circuit and converting them into a signal for a single-wire circuit wherein the output converter circuit comprises:

a first transfer gate for passing the rising edge of the output signal with speeded-up rising transition time from the first logic gate to supply it to a single-wire output terminal, a second transfer gate for passing the falling edge of the output signal with speeded-up falling transition time from the second logic gate to supply it to the single-wire output terminal, and a control circuit for repeatedly performing:

opening the first transfer gate in the state that the output signals of both of the first logic gate and second logic gate are 0 and latching the opening state;

supplying the rising edge to 1 of the output signal of the first logic gate from the opening first transfer gate to the single-wire output terminal;

opening the second transfer gate in the state that the output signals of both of the first logic gate and the second logic gate are 1 and latching the opening state; and supplying the falling edge to 0 of the output signal of the second logic gate from the opening second transfer gate to the single-wire output terminal.

15. A high-speed circuit transmission, comprising:

an input separator circuit for inputting a signal a single-wire circuit and separating the signal into two signals;

a two-wire transmitter circuit including at least one pair of logic gates outputting a first signal speeded up a rising transition time thereof from one of the logic gates and outputting a second signal speeded up a falling transition time thereof from the other of the logic gates; and an output converter circuit receiving in parallel the first signal and the second signal outputted from the two-wire transmitter circuit picking up an edge of the rising output signal with speeded-up rising transition time at the first logic gate and an edge of the falling output signal with speeded up falling transition time at the second logic gate, respectively and converting them into a signal for the single-wire circuit, the output converter circuit comprising:

a first transfer gate passing the rising edge of the output signal with speeded-up rising transition time at the first logic gate to supply it to a single-wire output terminal, a second transfer gate passing the falling edge of the output signal with speeded-up falling transition time at the second logic gate to supply it to the single-wire output terminal, and a control circuit repeatedly performing the following:
opening the first transfer gate in the state that the output signals of both of the first logic gate and the second logic gate are logic level 0 and latching the opening state;

supplying the rising edge to a logic level 1 of the output signal of the first logic gate from the opening first transfer gate to the signal-wire output terminal and closing the first transfer gate after a predetermined period; and alternatively opening the second transfer gate to supply a signal at a logic level 1 outputted from the subsequent second logic gate to the signal-wire output terminal.

16. A high-speed transmitter circuit comprising:

an input separator circuit inputting a signal for a single-wire circuit and separating the signal into two signals;

a two-wire transmitter circuit including at least one pair of logic gates, outputting a first signal speeded up a rising transition time thereof from one of the logic gates and outputting a second signal speeded up a falling transition time thereof from the other of the logic gates; and an output converter circuit receiving in parallel the first signal and the second signal outputted from the two-wire transmitter circuit, picking up an edge of the rising output signal with speeded-up rising transition time at the first logic gate and an edge of the falling output signal with speeded up falling transition time at the second logic gate, respectively and converting them into a signal for the single-wire circuit, the output converter circuit comprising:

a first transfer gate passing the rising edge of the output signal with speeded-up rising transition time at the first logic gate to supply it to a single-wire output terminal, a second transfer gate passing the falling edge of the output signal with speeded-up falling transition time at the second logic gate to supply it to the single-wire output terminal, and a control circuit repeatedly performing the following:
opening the second transfer gate in the state that the output signals of both of the first logic gate and the second logic gate are logic level 1 and latching the opening state;

supplying the falling edge to a logic level 0 of the output signal of the second logic gate from the opening second transfer gate to the single-wire output terminal and closing the second transfer gate after a predetermined period; and alternatively opening the first transfer gate to supply a signal at a logic level 0 outputted from the subsequent first logic gate to the single-wire output terminal.

* * * * *

UNITED STATES PATENT AND TRADEMARK OFFICE
CERTIFICATE OF CORRECTION

PATENT NO. : 7,154,293 B2
APPLICATION NO. : 11/066809
DATED : December 26, 2006
INVENTOR(S) : Keisuke Muraya It is certified that error appears in the above-identified patent and that said Letters Patent is hereby corrected as shown below:

On the Title Page Item (63) (Related U.S. Application Data), 1, change "PCT/JP02/123853" to --PCT/JP02/12853--.

Column 14, Line 41, after "circuit" delete "for".

Column 14, Line 60, change "speeded up" to --speeded-up--.

Column 14, Line 64, after "gate" delete "for".

Column 15, Line 1, after "gate" delete "for".

Column 15, Line 5, after "circuit" delete "for".

Column 15, Line 13, change "signal-wire" to --single-wire--.

Column 15, Line 18, change "signal-wire" to --single-wire--.

Column 17, Line 7, change "signal-wire" to --single-wire--.

Column 17, Line 12, change "signal-wire" to --single-wire--.

Column 17, Line 28, after "circuit" delete "for".

Column 17, Line 37, delete "for" before "outputting".

Column 18, Line 19, after "circuit" delete "for".

Column 18, Line 24, after "gate" delete "for".

Column 18, Line 31, after "circuit" delete "for".

Column 18, Line 46, change "circuit transmission," to --transmitter circuit--.

UNITED STATES PATENT AND TRADEMARK OFFICE
CERTIFICATE OF CORRECTION

PATENT NO. : 7,154,293 B2
APPLICATION NO. : 11/066809
DATED : December 26, 2006
INVENTOR(S) : Keisuke Muraya It is certified that error appears in the above-identified patent and that said Letters Patent is hereby corrected as shown below:

Column 19, Line 12, change "signal-wire" to --single-wire--.

Column 19, Line 17, change "signal-wire" to --single-wire--.

Signed and Sealed this

First Day of April, 2008

JON W. DUDAS
*Director of the United States Patent and Trademark Office*